United States Patent
Todd et al.

(10) Patent No.: US 7,585,752 B2
(45) Date of Patent: Sep. 8, 2009

(54) PROCESS FOR DEPOSITION OF SEMICONDUCTOR FILMS

(75) Inventors: Michael A. Todd, Phoenix, AZ (US); Mark Hawkins, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 54 days.

(21) Appl. No.: 10/963,043

(22) Filed: Oct. 12, 2004

(65) Prior Publication Data
US 2005/0064684 A1 Mar. 24, 2005

Related U.S. Application Data

(62) Division of application No. 10/074,563, filed on Feb. 11, 2002, now Pat. No. 6,821,825.

(60) Provisional application No. 60/340,454, filed on Dec. 7, 2001, provisional application No. 60/333,724, filed on Nov. 28, 2001, provisional application No. 60/332,696, filed on Nov. 13, 2001, provisional application No. 60/323,649, filed on Sep. 19, 2001, provisional application No. 60/311,609, filed on Aug. 9, 2001, provisional application No. 60/279,256, filed on Mar. 27, 2001, provisional application No. 60/268,337, filed on Feb. 12, 2001.

(51) Int. Cl.
*C23C 16/24* (2006.01)

(52) U.S. Cl. .................. 438/488; 438/507; 438/786; 438/791; 257/E21.097; 257/E21.111; 257/E21.207; 257/E21.277; 257/E21.307

(58) Field of Classification Search ............... 438/215, 438/287, 591, 931, 790, 791, 482, 488, 604, 438/391, 507, 786, 787; 118/723 MW, 723 ME, 118/723 MR, 723 MA; 257/E21.097, E21.102, 257/E21.111, E21.117, E21.207, E21.277, 257/E21.278, E21.293, E21.302
See application file for complete search history.

(56) References Cited

U.S. PATENT DOCUMENTS 4,188,444 A * 2/1980 Landau .................. 428/428

(Continued)

FOREIGN PATENT DOCUMENTS

EP 0368651 A2 5/1990

(Continued)

OTHER PUBLICATIONS

Wolf et al., Silicon Processing for the VLSI Era, vol. 1: Process Integration, 1986 by Lattice Press, pp. 161, 168 and 171.*

(Continued)

*Primary Examiner*—Matthew Smith
*Assistant Examiner*—Julio J Maldonado
(74) *Attorney, Agent, or Firm*—Knobbe Martens Olson & Bear LLP

(57) ABSTRACT

Chemical vapor deposition processes utilize chemical precursors that allow for the deposition of thin films to be conducted at or near the mass transport limited regime. The processes have high deposition rates yet produce more uniform films, both compositionally and in thickness, than films prepared using conventional chemical precursors. In preferred embodiments, a higher order silane is employed to deposit thin films containing silicon that are useful in the semiconductor industry in various applications such as transistor gate electrodes.

46 Claims, 20 Drawing Sheets

U.S. PATENT DOCUMENTS

| | | | | |
|---|---|---|---|---|
| 4,363,828 | A | 12/1982 | Brodsky et al. | 438/485 |
| 4,495,218 | A | 1/1985 | Azuma et al. | 427/583 |
| 4,585,671 | A | 4/1986 | Kitagawa et al. | 427/583 |
| 4,684,542 | A | 8/1987 | Jasinski et al. | 438/480 |
| 4,855,254 | A * | 8/1989 | Eshita et al. | 117/94 |
| 4,902,645 | A | 2/1990 | Ohba | |
| 5,091,761 | A | 2/1992 | Hiraiwa et al. | |
| 5,111,266 | A * | 5/1992 | Furumura et al. | 257/198 |
| 5,214,002 | A | 5/1993 | Hayashi et al. | 438/96 |
| 5,227,329 | A | 7/1993 | Kobayashi et al. | 438/307 |
| 5,287,205 | A * | 2/1994 | Yamazaki et al. | 349/174 |
| 5,356,821 | A | 10/1994 | Naruse et al. | 438/234 |
| 5,389,398 | A | 2/1995 | Suzuki et al. | 427/130 |
| 5,389,570 | A | 2/1995 | Shiozawa | 438/243 |
| 5,453,858 | A | 9/1995 | Yamazaki | 349/43 |
| 5,471,330 | A | 11/1995 | Sarma | 349/43 |
| 5,607,724 | A | 3/1997 | Beinglass et al. | 427/255.393 |
| 5,614,257 | A | 3/1997 | Beinglass et al. | 427/248.1 |
| 5,648,293 | A | 7/1997 | Hayama et al. | 438/485 |
| 5,656,531 | A | 8/1997 | Thakur et al. | 438/398 |
| 5,695,819 | A | 12/1997 | Beinglass et al. | 427/255.18 |
| 5,698,771 | A | 12/1997 | Shields et al. | 73/31.05 |
| 5,700,520 | A | 12/1997 | Beinglass et al. | 427/255.393 |
| 5,786,027 | A | 7/1998 | Rolfson | 427/124 |
| 5,789,030 | A | 8/1998 | Rolfson | 427/309 |
| 5,837,580 | A | 11/1998 | Thakur et al. | 438/255 |
| 5,874,129 | A | 2/1999 | Beinglass et al. | 427/248.1 |
| 5,876,797 | A | 3/1999 | Beinglass et al. | 427/255.18 |
| 5,885,869 | A | 3/1999 | Turner et al. | 438/261 |
| 5,959,326 | A | 9/1999 | Aiso et al. | |
| 6,027,705 | A | 2/2000 | Kitsuno et al. | 403/347 |
| 6,083,810 | A | 7/2000 | Obeng et al. | 438/448 |
| 6,103,600 | A | 8/2000 | Ueda et al. | 438/503 |
| 6,159,828 | A | 12/2000 | Ping et al. | 438/486 |
| 6,171,662 | B1 | 1/2001 | Nakao | 427/595 |
| 6,197,669 | B1 | 3/2001 | Twu et al. | 438/585 |
| 6,197,694 | B1 | 3/2001 | Beinglass | 438/694 |
| 6,228,181 | B1 | 5/2001 | Yamamoto et al. | 148/33.5 |
| 6,252,295 | B1 | 6/2001 | Cote et al. | |
| 6,294,399 | B1 * | 9/2001 | Fukumi et al. | 438/22 |
| 6,326,311 | B1 | 12/2001 | Ueda et al. | 438/694 |
| 6,373,112 | B1 * | 4/2002 | Murthy et al. | 257/407 |
| 6,455,892 | B1 | 9/2002 | Okuno et al. | 257/328 |
| 6,482,705 | B1 * | 11/2002 | Yu | 438/300 |
| 6,566,711 | B1 * | 5/2003 | Yamazaki et al. | 257/347 |
| 6,576,063 | B2 | 6/2003 | Toyoda et al. | 118/719 |
| 6,613,695 | B2 | 9/2003 | Pomarede et al. | 438/767 |
| 7,064,263 | B2 * | 6/2006 | Sano et al. | 136/249 |
| 2002/0098627 | A1 | 7/2002 | Pomarede | 438/149 |
| 2002/0160605 | A1 * | 10/2002 | Kanzawa et al. | 438/689 |
| 2002/0174826 | A1 * | 11/2002 | Maydan et al. | 117/84 |
| 2002/0174827 | A1 * | 11/2002 | Samoilov et al. | 117/84 |

FOREIGN PATENT DOCUMENTS

| | | |
|---|---|---|
| EP | 0486047 A2 | 5/1992 |
| EP | 0747974 A2 | 12/1996 |
| EP | 1065728 A2 | 1/2001 |
| GB | 2332564 A | 6/1999 |
| JP | 57209810 A | 12/1982 |
| JP | 59078918 A | 5/1984 |
| JP | 59078919 A | 5/1984 |
| JP | 60043485 A | 3/1985 |
| JP | S60-43485 | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 03292741 A | 12/1991 |
| JP | 04323834 A | 11/1992 |
| JP | 05021378 A | 1/1993 |
| JP | 05062911 A | 3/1993 |
| JP | H5-62911 | 3/1993 |
| JP | 07249618 A | 9/1995 |
| JP | 08242006 A | 9/1996 |
| JP | 11317530 | 11/1999 |

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.

Olivares, J. et al.; "Solid-phase crystallization of amorphous SiGe films deposited by LPCVD on $SiO_2$ and glass," Thin Solid Films 337 (1999) pp. 51-54.

Korean Non Final Rejection for App. 10-2008-7027835 mailed Feb. 13, 2009.

Korean Final Rejection for App. 10-2003-7010622 mailed Mar. 3, 2009.

EPO Office Action for App. 02 757 761.8 —1528 mailed Feb. 27, 2009.

* cited by examiner

SEM Photomicrograph of Si-Ge Film Deposited Using Silane and Germane

SEM Photomicrograph of Si-Ge Film Deposited Using Silane and Germane

SEM Photomicrograph of Si-Ge Film Deposited Using Trisilane and Germane

SEM Photomicrograph of Si-Ge Film Deposited Using Trisilane and Germane

SAD PATTERN OF POLYCRYSTALLINE SILICON FILM

CROSS SECTION OF CONFORMAL AMORPHOUS SILICON FILM

PROCESS FOR DEPOSITION OF SEMICONDUCTOR FILMS

RELATED APPLICATION INFORMATION

This application is a divisional of U.S. patent application Ser. No. 10/074,563, filed Feb. 11, 2002 now U.S. Pat. No. 6,821,825, which claims priority to: U.S. Provisional Application No. 60/268,337, filed Feb. 12, 2001; U.S. Provisional Application No. 60/279,256, filed Mar. 27, 2001; U.S. Provisional Application No. 60/311,609, filed Aug. 9, 2001; U.S. Provisional Application No. 60/323,649, filed Sep. 19, 2001; U.S. Provisional Application No. 60/332,696, filed Nov. 13, 2001; U.S. Provisional Application No. 60/333,724, filed Nov. 28, 2001; and U.S. Provisional Application No. 60/340,454, filed Dec. 7, 2001; all of which are hereby incorporated by reference in their entireties. This application is related to, and incorporates by reference in their entireties, co-owned and U.S. patent application Ser. No. 10/074,149 (now U.S. Pat. No. 6,716,751); Ser. Nos. 10/074,722; 10/074,633; 10/074,564; and 10/074,534, all of which were filed on Feb. 11, 2002.

BACKGROUND OF THE INVENTION

1. Field of the Invention

This invention relates generally to depositing semiconductor films, such as those containing Si, Ge and/or carbon for integrated circuit fabrication. More particularly, the invention relates to making these materials with greater thickness and compositional uniformity in chemical vapor deposition systems.

2. Description of the Related Art

As the dimensions of microelectronic devices become smaller, the importance of the physical and chemical properties of the materials used in their manufacture becomes more important. This is particularly true for those advanced materials that can be integrated into existing generations of devices using already-proven manufacturing tools. For example, it would be desirable to incorporate epitaxial $Si_{1-x}Ge_x$ and $Si_{1-x-y}Ge_xC_y$ alloys into Bipolar and BiCMOS device manufacturing processes. These advanced alloy materials have utility as base layers in heterojunction bipolar transistors (HBT), resistors in BiCMOS devices and as gate electrodes in CMOS devices and various other integrated electronic devices.

Conventional processes for the deposition of single crystal, amorphous and/or polycrystalline silicon, silicon germanium (SiGe) and silicon germanium carbon (SiGeC) alloys are typically performed using batch thermal processes (either low pressure (LP) or ultra-high vacuum (UHV) conditions) or single wafer processes. Single wafer processes are becoming increasingly significant, but a number of problems remain. For instance, within-wafer and wafer-to-wafer uniformity, deposition rates, and process repeatability remain a concern with conventional single wafer processes, particularly for in situ doped semiconductor films. As wafers continue to increase in size (currently 300 mm wafers are being integrated into fabrication processes), maintaining uniformity is becoming more challenging still.

Japanese Patent Application Disclosure Number S60-43485 discloses the use of trisilane to make amorphous thin films at 300° C., apparently for photovoltaic applications. Japanese Patent Application Disclosure Number H5-62911 discloses the use of trisilane and germane to make thin films at 500° C. or less. Japanese Patent Application Disclosure Number H3-91239, H3-185817, H3-187215 and HO2-155225 each disclose the use of disilane, some also mentioning trisilane.

The art has generally focused on the use of disilane and trisilane for producing amorphous, hydrogenated silicon at relatively low deposition temperatures. However, there remains a need for a process for depositing semiconductor materials such as doped silicon, low-H content amorphous silicon and SiGe onto surfaces, preferably at high deposition rates without sacrificing good uniformity.

SUMMARY OF THE INVENTION

The inventors have discovered better ways of making Si-containing and Ge-containing films. Methods are taught for using chemical precursors such as higher-order silanes and/or higher-order germanes in CVD processes to provide improved deposition of Si-containing films, particularly silicon, SiGe or SiGeC alloy thin films useful in the semiconductor industry. These chemical precursors have reduced thermal stability relative to silane, germane and conventional carbon-source molecules.

In accordance with one aspect of the invention, the use of particular precursors allows the deposition process to be conducted closer to, or within, a mass transport limited growth regime, relative to conventional precursors at the same temperature. Within this regime, temperature dependent non-uniformities, such as undesirable elemental concentration gradients and variable film deposition rates, and consequent thickness non-uniformities, can be avoided. Preferred chemical precursors include trisilane and trisilane in combination with digermane. Uniform deposition can be achieved at temperatures lower than those used for conventional chemical precursors, with higher film deposition rates.

In another aspect of the invention, flow rates of the preferred precursors are adjusted as a function of temperature to obtain higher deposition rates with equal or greater uniformity, as compared with deposition using conventional precursors (e.g., silane). The advantages of trisilane over silane have been found particularly applicable to the deposition of silicon-containing layers as active layers in integrated transistors.

In another aspect of this invention, methods are taught for stepwise or dynamically changing process parameters such as temperature, temperature distribution, pressure, reactant flow rate and reactant partial pressure in such a way as to reduce or eliminate such undesirable elemental concentration gradients, thickness non-uniformities and variable film deposition rates. These methods can be used in conjunction with the use of higher order silanes and/or germanes.

BRIEF DESCRIPTION OF THE DRAWINGS

These and other aspects of the invention will be readily apparent from the following description and from the appended drawings, which are meant to illustrate and not to limit the invention, and wherein.

DETAILED DESCRIPTION OF THE PREFERRED EMBODIMENTS

Figure 1:
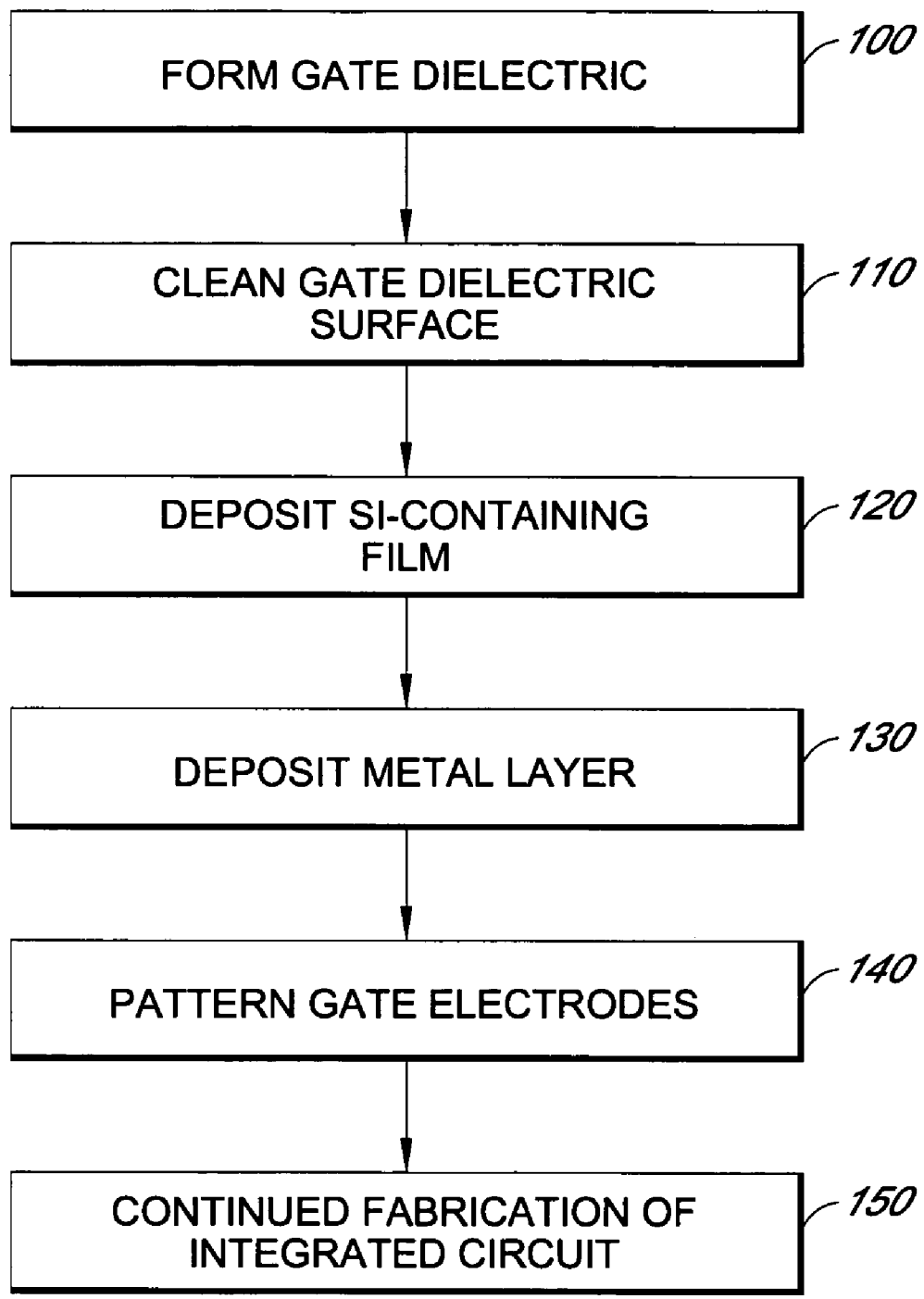
FIG. 1 is a flow chart generally illustrating the process of forming a gate stack in accordance with a preferred embodiment.

Dynamic temperature variations, due to limitations in heating and temperature control systems, play a significant role in the non-uniformity of film deposition on substrate surfaces by CVD. It is generally desirable for the deposited film to be as uniform as possible in both thickness and elemental composition, but existing processes tend to produce films that are non-uniform to varying degrees. Such non-uniformities often result from temperature variations across the surface of the substrate because the surface temperature of the substrate influences the deposition rate and the composition of the resulting film. Imperfect control over other process parameters, including gas flow rates and total pressure, are also believed to contribute to non-uniformities in film physical properties.

Uniformity is often sought by empirically tuning the deposition conditions e.g., gas flow rate, rotation speed of substrate, power distribution to heating elements, etc., to achieve an overall uniform thickness for the desired film. This is done by first depositing a large number of films on different substrates, each under a different pre-selected set of deposition conditions. The thickness variations within each film are then measured and the results analyzed to identify conditions that would eliminate the thickness variations. The inventors have realized, however, that this empirical process does not necessarily achieve uniform temperature distributions throughout the process; rather, the process effectively time-averages the thickness variations produced by the temperature variations for a specific reaction temperature 'set-point'.

Accordingly, this empirical approach does not necessarily produce uniform temperatures across the substrate throughout the deposition process. This, in turn, raises the issue of compositional variation because compositional homogeneity (or at least control) is desired in three dimensions, both across the film surface and through the film thickness. This is because many films contain dopants and the level of these dopants influences the electronic properties of the film. Non-uniform temperatures can result in non-uniform incorporation of dopants into the film. Similarly, other non-uniformities in composition can result.

The preferred embodiments provide processes for solving this problem, each of which may be used individually or, preferably, together. One process involves the use of chemical precursors that allow for film deposition to be conducted substantially within a mass transport limited growth regime, relative to conventional precursors at the same temperature. For a given chemical precursor, the mass transport limited regime is a temperature range in which film deposition rates are independent of temperature. Deposition rates that are substantially within this temperature range are relatively unaffected by small temperature variations across the surface of the substrate, so long as those variations result in temperatures that remain at or near the mass transport limited regime. This allows for the production of films that are much more uniform, e.g., exhibit higher compositional uniformity and/or thickness uniformity, than films deposited at the same temperature using conventional chemical precursors. This is because conventional precursors require much higher temperatures in order for deposition to be in the mass transport limited regime.

Figure 10:
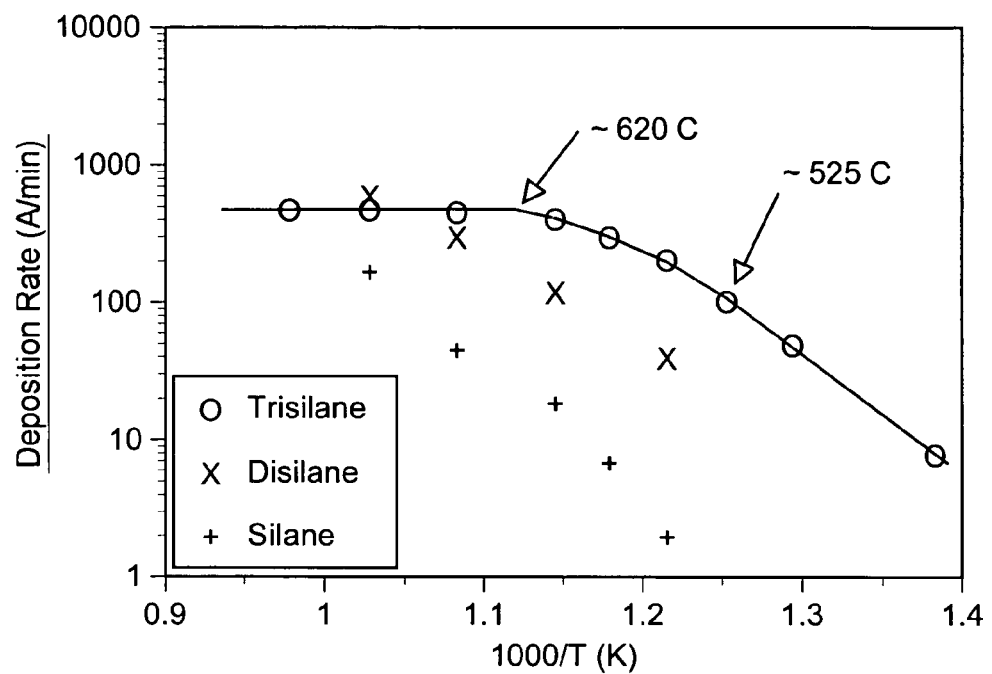
FIG. 10 shows an Arrhenius plot obtained under the conditions described below for silane, disilane, and trisilane.

As will be appreciated by the skilled artisan, the temperature range for the mass transport limited regime can be determined for a given precursor and set of reaction conditions, and illustrated in an Arrhenius plot. For the chemical precursor trisilane, the transition point from temperature-dependent deposition rates to temperature-independent deposition rates is much lower than the transition point for silane or disilane, as illustrated in the Arrhenius plot shown in FIG. 10. The lower region of the plot up to the transition has a significant upward linear slope, indicating that deposition of trisilane within this temperature range is a strong function of temperature and therefore not within the mass transport limited regime. For example, FIG. 10 shows that trisilane deposition is not mass transport limited (i.e., is within the kinetic regime) at temperatures less than about 525° C., under the conditions used (25 sccm flow rate, 40 Torr pressure). In contrast, the region of the plot above the transition point is substantially flat, indicating that deposition of trisilane within this temperature range is independent of temperature and therefore within the mass transport limited regime. For example, FIG. 10 shows that trisilane deposition is clearly mass transport limited at temperatures of about 620° C. or greater. It will be understood that the transition occurs over a range of temperatures in which the declining slope of the Arrhenius plot indicates that the deposition of trisilane within this temperature range is substantially independent of temperature, near the mass transport limited regime. For example, FIG. 10 shows that trisilane deposition is substantially mass transport limited at temperatures of about 525° C. or greater. It will be understood that the transition point may increase somewhat at higher flow rates, and decrease somewhat at lower flow rates. For example, it has been determined experimentally that the transition point from temperature-dependent deposition to substantially mass transport limited deposition shifts to higher temperatures when the trisilane flow rate is increased. Accordingly, the use of trisilane enables substantially mass transport limited deposition at temperatures that are desirable for other reasons in contemporary fabrication (e.g., conservation of thermal budgets for maintaining crystal properties, controlling dopant profiles, etc.).

A variety of silicon- and germanium-containing chemical precursors can be suitably used in the film deposition processes disclosed herein to provide Si-containing films, Ge-containing films and alloy films that contain both Si and Ge, e.g., silicon germanium (SiGe, without implying stoichiometry) films. These chemical precursors may also be used in conjunction with carbon sources to provide alloy films, e.g., SiGeC (without implying stoichiometry) alloy thin films. Preferred Si-containing chemical precursors suitable for use in the instant invention include higher-order, non-halogenated hydrides of silicon, particularly silanes of the formula $Si_nH_{2n+2}$ where n=2-6. Particular examples include disilane ($H_3SiSiH_3$), trisilane ($H_3SiSiH_2SiH_3$), and tetrasilane ($H_3SiSiH_2SiH_2SiH_3$). Trisilane (also represented by $Si_3H_8$) is most preferred for achieving a balance of volatility and reactivity. Substantially or nearly mass transport limited deposition, at relatively low temperatures, is preferred (but not necessary) for SiGe deposition. Preferred Ge-containing chemical precursors suitable for use in the instant invention include higher-order germanes of the formula $Ge_nH_{2n+2}$ where n=2-3. In other arrangements, the germanium source can comprise $(H_3Ge)(GeH_2)_x(GeH_3)$, where x=0-2. Particular examples include digermane ($H_3GeGeH_3$), trigermane ($H_3GeGeH_2GeH_3$) and tetragermane ($H_3GeGeH_2GeH_2GeH_3$).

In a preferred embodiment, the chemical precursors are used in conjunction with a source of carbon. Preferred carbon sources include silylmethanes $[(H_3Si)_{4-x}CR_x]$ where x=0-3 and R=H and/or D. The preferred silylmethanes are disilylmethane, trisilylmethane and tetrasilylmethane (x=0-2), with tetrasilylmethane being most preferred. Additional preferred carbon sources include hydrocarbons such as methane, ethane, propane, butanes, etc.; carbon monoxide, carbon dioxide and HCN. These chemical precursors and carbon sources may be purchased from commercial sources or synthesized by methods known to those skilled in the art. Si-containing films such as SiC, SiNC and SiOC (none of which short forms imply a particular stoichiometry) have a variety of uses in the semiconductor manufacturing industry, e.g., as etch stop layers, hard masks, and passivation layers.

The films are preferably deposited at a temperature that is substantially within the mass transport limited regime for the particular chemical precursor that is used. For any particular chemical precursor and set of reaction conditions, the mass transport limited regime can be determined from an Arrhenius plot empirically-derived from deposition data at various temperatures. The Arrhenius plot for the most preferred silicon precursor, trisilane, for a particular set of conditions is appended as FIG. 10, discussed above.

In addition to employing preferred chemical precursors (particularly trisilane) as described herein and selecting a deposition temperature within the mass transport limited regime for that precursor, deposition using the first process preferably involves proper selection of other deposition parameters, particularly gas flow rate. Proper selection of gas flow rate, in combination with deposition substantially within the mass transport limited regime, has been found to yield films at much higher deposition rates compared to silane, while maintaining a high degree of uniformity. For depositions using silane at temperatures in the kinetic regime, film uniformity depends primarily on the temperature controller set points and, to a much lesser extent, the gas flow rate controller set points. In contrast, for depositions involving higher-order silanes at temperatures substantially within the mass transport limited regime, it has been found that the sensitivity to temperature controller set points and gas flow controller set points is reversed. For example, for depositions using trisilane at temperatures substantially within the mass transport limited regime, tuning the temperature controller set points has much less effect on film uniformity than tuning the gas flow rate controller set points.

When deposition is conducted as described herein, the resulting film is preferably more uniform than a comparable film. As used herein, a "comparable" film is made in a manner that is substantially identical in all meaningful aspects to the inventive film in question, except that silane is used in place of a higher-order silane and/or germane is used in place of a higher-order germane, and the deposition process for each film is individually tuned to take into account the aforementioned differences in sensitivity to temperature and gas flow controller set points. More particularly, when comparing the results of different layers, thickness uniformity is to be measured by the following standard: a randomly selected diameter across a wafer is employed and 49 points along that diameter are measured for deposited layer thickness. No measurements are taken within a 3 mm exclusion zone at the wafer periphery. The range in thickness measurements (e.g., ±6 Å) over those 49 points is then divided by the sum of the maximum thickness measurement plus the minimum thickness measurement from among the 49 points. This non-uniformity is expressed as a percentage herein. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein. Advantageously, the methods employing the precursors described herein have been found to result in extraordinarily high deposition rates and yet, surprisingly, obtain exceptionally high uniformity and smoothness.

For example, a preferred polycrystalline silicon film is made using trisilane and has greater uniformity at greater deposition rates than a comparable film made from a process separately optimized using silane in place of said trisilane at the same temperature. Similarly, the inventors have separately experimented with and found amorphous silicon (α-Si) layers and epitaxial silicon (epi-Si) layers formed with trisilane to exhibit better uniformity as compared with silane-deposited layers. See FIGS. 15-18 and corresponding text hereinbelow. Likewise, a preferred SiGe film is made using a higher order germane and has greater uniformity than a comparable film made using germane in place of said higher-order germane. Furthermore, higher deposition rates at a lower reaction temperature are also attainable using the silicon and germanium sources disclosed.

Figure 11:
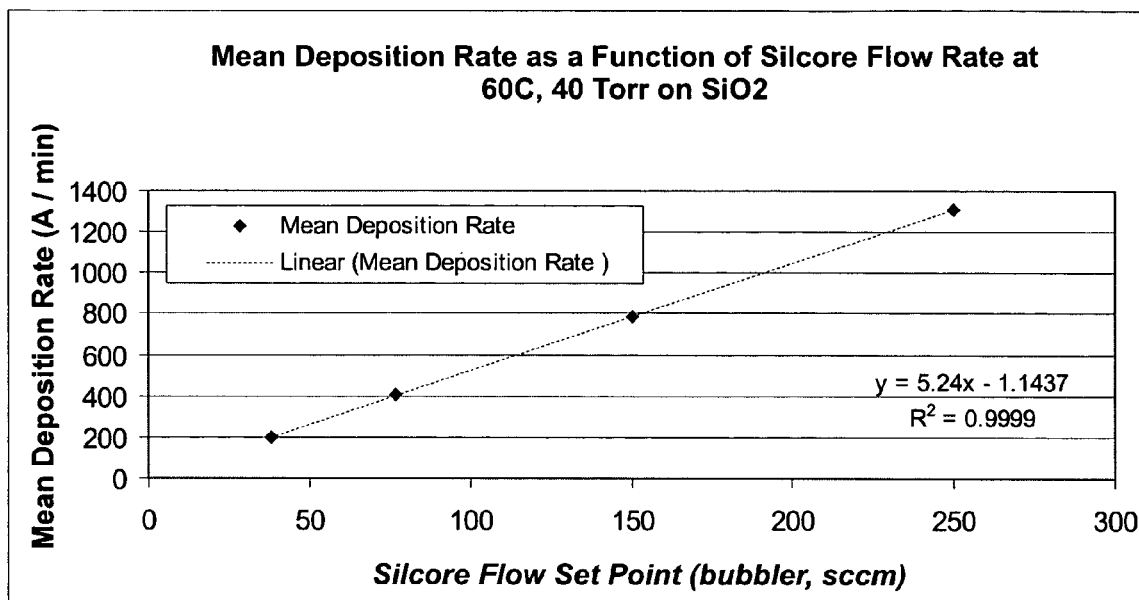
FIG. 11 shows a plot illustrating film deposition rate on an oxide substrate as a function of trisilane (Silcore™) flow rate at 600° C., 40 Torr.
Figure 12:
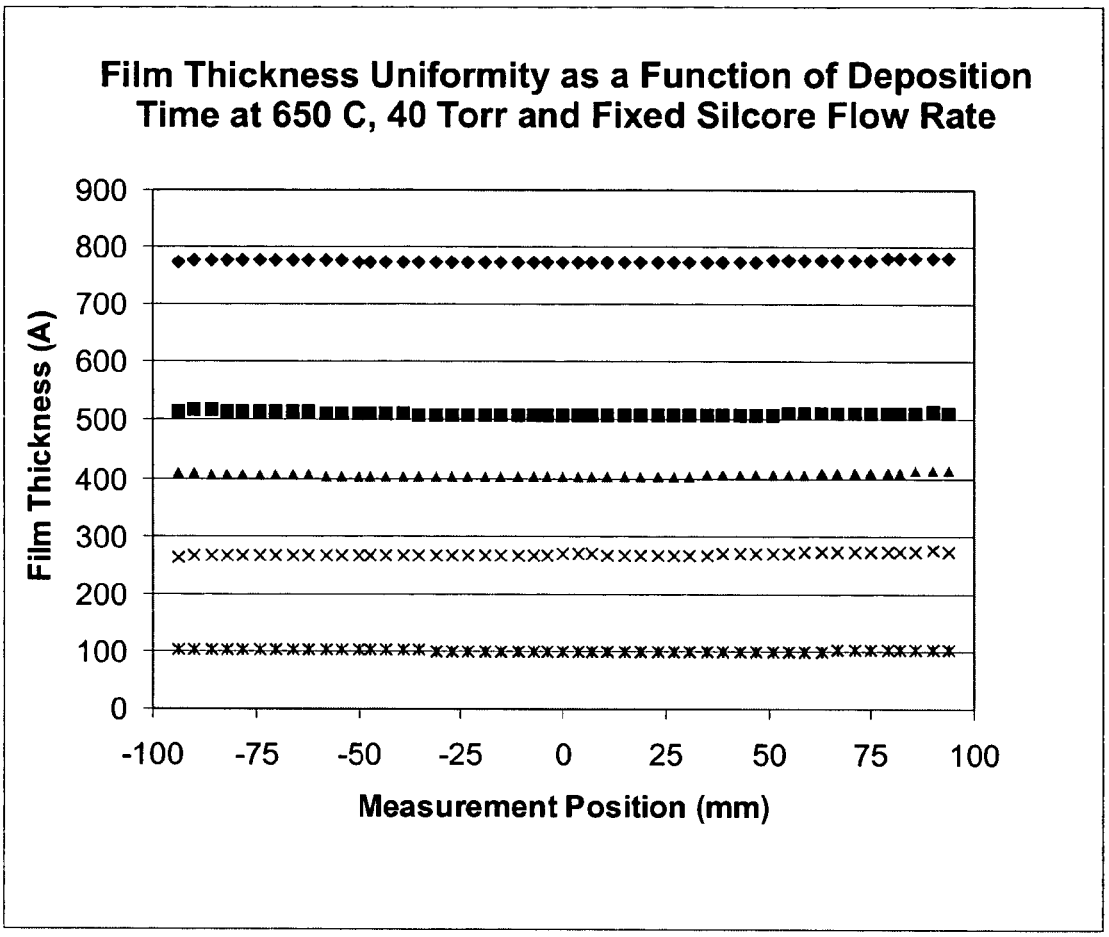
FIG. 12 shows a plot illustrating film thickness as a function of position for various deposition times using trisilane (Silcore™) at 650° C., 40 Torr.
Figure 13:
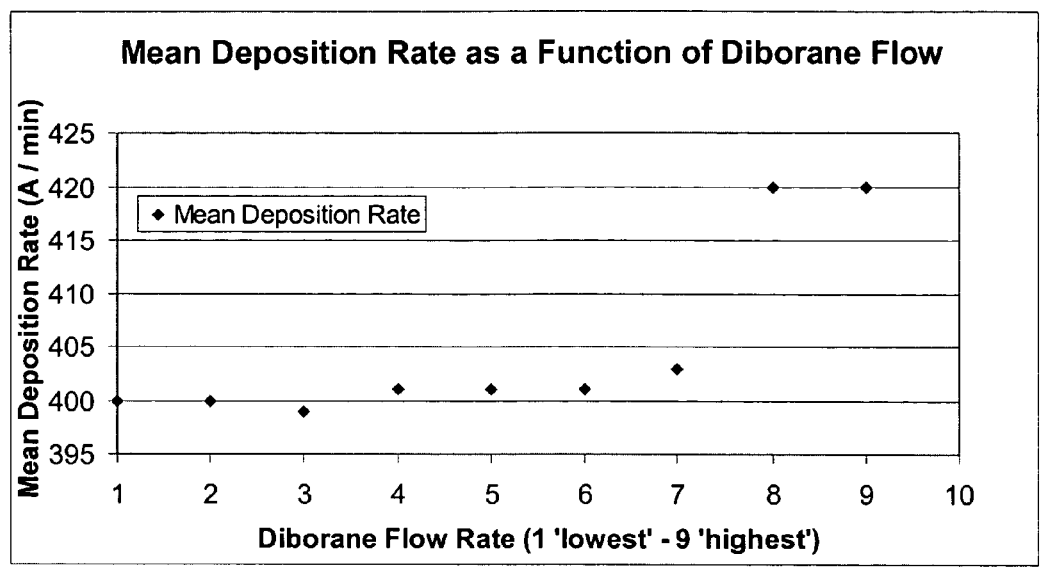
FIG. 13 shows a plot of deposition rate as a function of diborane flow for deposition using trisilane.

FIG. 11 shows that deposition rate is a linear function of the trisilane (referred to as "Silcore™" in some of the figures) flow rate at a deposition temperature of 600° C. and a pressure of 40 Torr. This linearity is a further indication that trisilane deposition is substantially or nearly mass transport limited under these conditions and further indicates very low nucleation times over oxide. FIG. 12 is a plot of film thickness as a function of measurement site for films deposited using trisilane under identical conditions (650° C., 40 torr), except that the deposition time was varied over a range from 90 seconds to 15 seconds as indicated. FIG. 12 shows that, at a fixed trisilane flow rate, exceptional film uniformity is obtained for a wide range of deposition times, indicating that the results are not merely time-averaged but result from the nature of the precursor and selected conditions, and further that emissivity (or other thickness-dependent temperature control) effects do not alter the uniformity, since the layers remain uniform regardless of thickness. FIG. 13 is a plot of the deposition rates obtained using trisilane and diborane (a dopant precursor) at a deposition temperature of 600° C. and a pressure of 40 Torr, over a range of diborane flow rates (zero to 180 sccm). FIG. 13 shows that deposition rates using trisilane are relatively insensitive to the flow rate of the dopant precursor.

The preferred temperature range tends to depend on the particular chemical precursor, with lower temperatures being more appropriate as the thermal stability decreases. For higher-order silanes and higher order germanes, lower temperatures are preferred as chain-length increases. Thus, the preferred temperature range for disilane deposition tends to be higher than for trisilane, which in turn tends to be higher than for tetrasilane, etc. A similar trend holds for the germane series. A preferred temperature for depositing trisilane is higher than about 350° C., preferably higher than about 450° C. in order to minimize hydrogen content in the resulting film. More preferably, in order to attain deposition near or within the mass transport limited regime, temperatures are maintained higher than about 525° C., even more preferably higher than about 550° C., most preferably higher than about 600° C. The process may be carried out at a temperature above 700° C., but a temperature of about 700° C. or less is preferred. Preferred temperatures are thus in the range of 450° C. to about 700° C., more preferably in the range from about 525° C. to about 650° C. For any particular chemical precursor or mixture thereof, the most preferred temperature range may be found through routine experimentation, following the guidelines provided herein. It will be understood that the listed temperatures are preferred for thermal CVD. Lower temperatures will be appropriate for plasma assisted deposition processes, depending upon the level of hydrogen incorporation that is acceptable for the application.

Selection of the deposition temperature can also depend partly upon the desired crystallinity in the layer being deposited. For example, predominantly crystalline silicon can be deposited in the range of about 620° C. to 800° C., which is clearly within the mass transport limited regime, as discussed above. More preferably, polysilicon deposition is conducted between 650° C. and 750° C. Lower temperatures can be used for amorphous silicon deposition, but preferably temperatures are selected to remain at least substantially mass transport limited (i.e., preferably at higher than 525° C. for the preferred conditions). Epitaxial silicon is largely dependent upon the purity of the surface upon which deposition is to take place. Namely, as will be recognized by the skilled artisan, an extremely clean single-crystal surface, such as the upper surface of a previously-deposited epitaxial layer or the upper surface of a single crystal wafer, enables epitaxial deposition at a large range of temperatures, depending upon flow rates, pressure, etc. Typically, epitaxial deposition upon a suitable surface can take place between 500° C. and 1160° C. It is preferred to employ the lower temperature ranges, such as from about 500° C. to about 750° C., for reasons of consideration of thermal budgets. See FIGS. 15-18 and corresponding text hereinbelow.

Preferably, deposition is carried out using a chemical precursor e.g., higher-order silane and/or higher-order germane, at a temperature that is effective to achieve higher deposition rates and/or more uniform films, as compared to comparable films made using silane and/or germane.

Deposition of these chemical precursors may be suitably conducted according to the various vapor deposition methods known to those skilled in the art, but the greatest benefits are obtained when deposition is conducted according to the improved chemical vapor deposition (CVD) process techniques taught herein. The disclosed processes may be suitably practiced by employing CVD, including plasma-enhanced chemical vapor deposition (PECVD) or thermal CVD, utilizing a feed gas comprised of a Si- and/or Ge-containing chemical precursor to deposit a Si- and/or Ge-containing film onto a substrate contained within the CVD chamber. In a preferred embodiment, the gas is comprised of trisilane and a Si-containing film is deposited. In another preferred embodiment, the gas is comprised of a higher-order silane and a higher-order germane, and a SiGe film is deposited.

A suitable manifold may be used to supply feed gas(es) to the CVD chamber. Experimental results described herein were conducted in a CVD chamber with horizontal gas flow, and preferably the chamber is a single-wafer, horizontal gas flow reactor, preferably radiatively heated. Suitable reactors of this type are commercially available, and preferred models include the Epsilon™ series of single wafer epitaxial reactors commercially available from ASM America, Inc. of Phoenix, Ariz. While the processes described herein can also be employed in alternative reactors, such as a showerhead arrangement, benefits in increased uniformity and deposition rates have been found particularly effective in the horizontal, single-pass, laminar gas flow arrangement of the Epsilon™ chambers.

The chemical precursors are preferably supplied to the CVD chamber in the form of a feed gas or as components of a feed gas, at the temperatures and pressures used for deposition. The total pressure in the CVD chamber is preferably in the range of about 0.001 Torr to about 700 Torr, more preferably in the range of about 0.1 Torr to about 200 Torr, most preferably in the range of about 1 Torr to about 60 Torr. The partial pressure of each Si- and/or Ge-containing chemical precursor is preferably in the range of about $1\times10^{-6}$% to about 100% of the total pressure, more preferably about $1\times10^{-4}$% to about 100%, same basis. At much lower pressures than 1 Torr (as is typical for batch LPCVD processes), high conformality can be achieved, but it is difficult to nucleate continuous layers. On the other hand, at much higher pressure ranges (e.g., atmospheric), it has been found that nucleation also appears to be less rapid. The preferred ranges achieve a fine balance of temperature control insensitivity to patterned wafers and attendant emissivity effects, while obtaining very fast nucleation over oxides, particularly using trisilane. Surprisingly, conformality remains excellent at the preferred pressure ranges using trisilane for CVD, despite much higher pressures than those employed in LPCVD processes. The partial pressure of each carbon source, if any, is preferably in the range from 0% to about 1% of the total pressure, more preferably about $1\times10^{-6}$% to about 0.1%, same basis. If used, the partial pressure of the carbon source is preferably effective to provide the resulting Si-containing and/or Ge-containing film with a carbon content of about 20% or less (10% or less for single crystal materials), even more preferably about 10% or less (5% or less for single crystal materials), where the percentages are by weight based on total film weight.

The feed gas can also include gases other than chemical precursor(s) and carbon sources, such as inert carrier gases. Exemplary carrier gases include helium, argon, krypton and neon. Hydrogen is most preferred as a carrier gas for the processes described herein, particularly for single crystal materials. Nitrogen can also be employed for polycrystalline and amorphous film deposition. Other compounds can be present in the feed gas as desired. Preferably the gas is further comprised of one or more compounds selected from the group consisting of silane, disilane, tetrasilane, germane, digermane, trigermane, $NF_3$, monosilylmethane, disilylmethane, trisilylmethane, tetrasilylmethane, and a dopant precursor.

Dopant precursors include diborane, deuterated diborane, phosphine, and arsine. Silylphosphines $[(H_3Si)_{3-x}PR_x]$ and silylarsines $[(H_3Si)_{3-x}AsR_x]$ where x=0-2 and $R_x$=H and/or D are preferred dopant sources of phosphorous and arsenic. $SbH_3$ and trimethylindium are preferred sources of antimony and indium, respectively. Such dopants and dopant sources are useful for the preparation of preferred films such as boron-, phosphorous-, antimony-, indium-, and arsenic-doped silicon, SiGe and SiGeC films, by the methods described herein. The dopant concentration in these materials, when doped, is preferably in the range of from about $1 \times 10^{14}$ to about $1 \times 10^{22}$ atoms/cm$^3$. Dopants can be incorporated using very low concentrations of the dopant sources, e.g., as mixtures in hydrogen with concentration ranging from about 1 ppm to about 1%, by weight based on total. These diluted mixtures can then be delivered to the reactor via a mass flow controller with set points ranging from 10 to 200 standard cubic centimeters per minute (sccm), depending on desired dopant concentration and dopant gas concentration. The dopant source is also preferably further diluted in the carrier gas delivered to the reactor with the silicon/germanium/carbon sources. Since typical flow rates often range from about 20 standard liters per minute (SLM) to about 180 SLM, the concentration of the dopant used in a typical process is typically very small.

The relative partial pressures of the chemical precursors (and carbon source, if any) can be held relatively constant over the course of depositing the Si-containing and/or Ge-containing film, or can be varied to produce a graded film that has differing amounts of Si and/or Ge as a function of depth within the thickness of the film. Preferably, the film has a thickness in the range of about 10 Å to about 5,000 Å. The elemental composition of the film may vary in a stepwise and/or continuous fashion. Film thickness may be varied according to the intended application as known in the art, by varying the deposition time and/or gas flow rates. Whether constant or graded, compound and doped films deposited by the methods described herein have relatively constant composition across a plane at any particular given depth. The "plane" in this sense may undulate if the film is deposited over a patterned substrate.

Deposition of the films described herein is preferably conducted at a rate of about 50 Å per minute or higher, more preferably about 75 Å per minute or higher, most preferably about 100 Å per minute or higher. The resulting Si-containing film is preferably selected from the group consisting of a SiGe film, a SiGeC film, a silicon nitride film (SiN, without implying stoichiometry), a silicon oxide film (SiO, without implying stoichiometry), a silicon oxynitride film (SiON, without implying stoichiometry), a boron-doped film, an arsenic-doped film, a phosphorous-doped film, and a film having a dielectric constant of about 2.2 or lower. Methods for making suitable low-k films are disclosed in co-pending and co-owned U.S. application Ser. No. 09/993,024, filed Nov. 13, 2001, the disclosure of which is incorporated herein by reference. The Si-containing film can be amorphous, polycrystalline or epitaxial. Trisilane has been shown to be particularly advantageous for improving deposition rates and uniformity of epitaxial silicon layers.

The preferred embodiments also provide another process for solving the uniformity problems discussed above. Examples of this process are given in FIG. 3 and Example 39, and the process is described more generally here. Through-thickness compositional non-uniformities in deposited films are believed to result from, inter alia, dynamic (as opposed to static) variations in substrate surface temperature. CVD chambers are generally equipped with a temperature controller that is configured to allow programming with a set of temperature control conditions that are kept constant throughout the deposition of a particular layer. This set point temperature is generally selected at the beginning of the process and maintained until the layer is completed. As discussed above, the thickness problem was approached in the past by empirically tuning the deposition conditions e.g., gas flow rate, rotation speed of substrate, power distribution to heating elements, etc., to effectively time-average the thickness effects of the temperature variations.

It has been found that a temperature set point, or a set of reactor conditions affecting temperature control more generally, that results in a film that is relatively uniform in composition and thickness for the first 5 Å to 1,000 Å of film deposition can be found empirically, but the film then typically becomes less uniform as deposition continues. The reasons for this are not well understood, and this invention is not limited by theory, but emissivity and other properties of the substrate, that change as a function of deposition time, can affect the temperature control system. This, in turn, can produce temperature variations that result in compositional and thickness variations.

Whatever the reason for the shift to less uniform deposition, it has now been found that a layer-by-layer approach can be used to produce films having greater uniformity. In accordance with this embodiment, a set of empirically-determined temperature set points $T_1$, $T_2$, $T_3$, etc. can be determined on a layer-by-layer basis. A single film, having a single function at a particular point in an integrated circuit, is broken down into several layers during the empirical determination and optimal set points are determined for each layer. Accordingly, temperature control variations caused by the growing thickness of the film can be compensated by use of separately optimized set points during the deposition process.

Such an empirical determination can be conducted by first depositing a first layer on each of a number of separate workpieces using various temperature set points, then measuring the thickness and compositional variation of the first layer on each workpiece to identify which set point resulted in the most uniform layer. The target thickness of the layer may vary as desired, e.g., from about 50 Å to about 1,000 Å, preferably about 100 Å to about 700 Å, depending on the level of uniformity required for the particular application.

A first layer is then prepared on several more workpieces at the identified set point $T_1$ to serve as substrates for the empirical determination of the second set point $T_2$. As in the determination of $T_1$, a second layer is deposited onto the first film of each of these workpieces using various temperature set points, then the thickness and compositional variation of each layer is measured to identify which second set point resulted in the most uniform second layer. As above, the target thickness of the second layer may vary as desired, e.g., from about 50 Å to about 1,000 Å, preferably about 100 Å to about 700 Å, depending on the level of uniformity required for the particular application. The process can then be halted, if the optimized first and second layers form a multi-layer film having the desired thickness and degree of uniformity. If a thicker film is desired, the process can be continued by, e.g., preparing a batch of workpieces having two layers deposited at the first two identified set points $T_1$ and $T_2$, depositing a third layer onto the second layer of each workpiece using various temperature set points, measuring the thickness and compositional variation of each layer to identify which third set point $T_3$ resulted in the most uniform third layer, etc.

Temperature set point is used herein as an example of a temperature control variable that is normally kept constant during a deposition process, but that can be varied during deposition by the empirical process taught above. This empirical process can also be applied to other temperature control variables that are normally kept constant during a single film deposition process, such as temperature offsets for a PID controller or PID coefficient(s).

Process variables such as gas flow rate, gas flow distribution, partial pressure and gas composition are preferably varied in processes similar to that described above for identifying the temperature set point, or during the same experiments, in order to identify the desired deposition conditions for each layer. Preferably, experimental design methods are used to determine the effect of the various process variables and combinations thereof on uniformity and/or deposition rate. Experimental design methods per se are well-known, see e.g., Douglas C. Montgomery, "Design and Analysis of Experiments," $2^{nd}$ Ed., John Wiley and Sons, 1984. For a particular process, after the effect of the various process variables and combinations thereof on layer uniformity and/or deposition rate has been determined by these experimental design methods, the process is preferably automated by computer control to ensure batch-to batch or wafer-to-wafer consistency. Most preferably, the process improvements result from in-situ, stepwise or dynamic adjustments to the process variables mentioned above. This empirical method of tuning process variables to individually improve the properties of the layers has been found to improve the properties of the overall single structural or functional film (comprising multiple layers from a process standpoint) regardless of any theory expressed herein. Therefore, the functioning of this embodiment does not depend on the correctness or incorrectness of any theory.

Having determined the desired set points $T_1$, $T_2$, $T_3$, $T_4$, etc., the preferred embodiment may be practiced using a CVD chamber that is equipped with a temperature controller configured to allow programming with multiple temperature set points for a single recipe. The process is preferably conducted by entering a temperature set point T, into a temperature controller and introducing a first gas comprised of $X_1$% of a first Si-containing chemical precursor to the CVD chamber; where $X_1$ is in the range of about 0 to about 100. A first Si-containing layer is then deposited onto a substrate contained within the chamber. The process is preferably continued by entering a temperature set point $T_2$ into the temperature controller, introducing a second gas comprised of $X_2$% of a second Si-containing chemical precursor to the CVD chamber, and depositing a second Si-containing layer onto the first Si-containing layer, thereby forming a multi-layer Si-containing film. The second Si-containing chemical precursor may be chemically identical to the first Si-containing chemical precursor or may be different, as discussed below and illustrated by FIG. 3 and Example 39.

The process can be continued further by, e.g., entering a temperature set point $T_3$ into the temperature controller, introducing a third gas comprised of $X_3$% of a third Si-containing chemical precursor to the CVD chamber, and depositing a third Si-containing layer onto the second Si-containing layer, and so on, producing as many layers as desired.

Preferred Si-containing chemical precursors include higher order silanes as described elsewhere herein, as well as conventional chemical precursors such as silane. Preferably at least one of the first Si-containing chemical precursor and the second Si-containing chemical precursor is selected from the group consisting of silane, disilane and trisilane. At least one of the first gas, second gas and third gas is preferably comprised of a compound selected from the group consisting of germane, digermane, trigermane, $NF_3$, monosilylmethane, disilylmethane, trisilylmethane, tetrasilylmethane, and a dopant precursor, as described elsewhere herein. Preferably, the amount of each Si-containing chemical precursor $X_n$, for $X_1$%, $X_2$%, $X_3$%, $X_4$%, etc., in the gas is independently in the range of about $1\times10^{-6}$% to about 100%, preferably about $1\times10^{-4}$% to about 100%, by volume based on total volume, at any particular stage of the deposition process.

The substrate preferably has a temperature of about 350° C. or higher, more preferably in the range of 450° C. to about 700° C. The CVD chamber is preferably a single-wafer, horizontal gas flow reactor. The resulting multiple layer Si-containing film is preferably selected from the group consisting of a microdot, a SiGe film, a SiGeC film, a SiN film, a silicon-oxygen film, a silicon-oxygen-nitrogen film, a boron-doped film, an arsenic-doped film, a phosphorous-doped film, and a film having a dielectric constant of about 2.2 or lower. Methods for making suitable low-k films are disclosed in co-pending and co-owned U.S. application Ser. No. 09/993, 024, filed Nov. 13, 2001, the disclosure of which is incorporated herein by reference.

The processes of the preferred embodiments may be practiced by depositing the multiple layers of the film in a stepwise or continuous fashion. Advantageously, when the deposition is paused to adjust the temperature set point, process variables such as flow rate, partial pressure and gas composition can also be adjusted as desired to produce films having various compositions. For instance, the deposited film may have a homogenous or uniform composition as discussed above, or may vary in composition step-wise or continuously. The identity of the Si-containing chemical precursor can be altered during the pause, and/or the amount in the gas $X_1$%, $X_2$%, $X_3$%, $X_4$%, etc. can be varied. In a preferred embodiment, the process involves the growth of a graded germanium concentration layer by non-continuous or step-wise changes in germanium concentration, preferably achieved by preparing a superlattice with discontinuous periodicity by depositing layers of selected germanium concentration on top of each other. Example 39, in conjunction with Example 43 below, illustrates this embodiment.

It will be understood that the overall "film" of this embodiment constitutes a single structural film from the point of view of its function in an integrated circuit, and will typically have a similar composition throughout its thickness. Similar composition, for defining a single film formed by the stepwise deposition process described above, thus encompasses graded films wherein the same constituents have different concentrations at different points through the thickness of the film.

Methods of determining film uniformity and deposition rates are well known. Deposition rates may be determined by measuring the average thickness of the film as a function of time and can be expressed in units of angstroms per minute (Å/min.). Preferred deposition rates are about 20 Å/min. or greater, more preferably about 50 Å/min. or greater, most preferably 100 Å/min. or greater. Suitable methods for measuring film thickness include multiple-point ellipsometric methods. Instruments for measuring film thickness are well known and commercially available and preferred instruments include the NanoSpec® series of instruments from Nanometrics, Inc., Sunnyvale, Calif.

The term "uniformity," as used herein to refer to the uniformity of deposited films, is used to refer to both thickness uniformity and compositional uniformity. Film thickness uniformity is preferably determined by making multiple-point thickness measurements, determining the mean thickness, and determining the average amount that the multiple measurements differ from the mean. To enable comparisons, the result can be expressed as percent non-uniformity. Preferably, the percent non-uniformity is about 10% or less, more preferably about 5% or less, most preferably about 2% or less. Compositional uniformity may be determined using electrical measurements (i.e. 4-point probe), SIMS (Secondary Ion Mass Spectrometry), RBS (Rutherford Backscattering Spectroscopy), Spectroscopic Ellipsometry and/or high resolution X-ray diffractometry (HR-XRD).

When comparing one Si-containing film to another, or one deposition process to another, compositional uniformity is measured using SIMS across a circular wafer substrate onto which the Si-containing has been deposited. SIMS measurements are made at three locations: one at the center of the wafer, one at a point midway between the center and the edge ("r/2"), and one at a point 3 millimeters from the edge ("3 mm edge exclusion"). For each non-silicon element in question, the amount of that element at each location is then determined from the SIMS data, and the resulting value expressed in atomic % based on total. The three values are then averaged, and the standard deviation determined.

For a given Si-containing film or deposition process, compositional non-uniformity is the standard deviation divided by the sum of the maximum and minimum measured values, and the result expressed as a percentage. For example, if the three values are 3 atomic %, 5 atomic %, and 10 atomic %, the compositional non-uniformity is 28% because the sum of the minimum and maximum values is 13 and the standard deviation is 3.6 (3.6/13=28%). Preferred values of compositional non-uniformity vary, depending on the amount of the element in the Si-containing film. If the amount of element is 1 atomic % or greater, the compositional non-uniformity for the Si-containing film is preferably about 25% or less, more preferably about 20% or less, even more preferably about 15% or less, most preferably about 10% or less. Ge content in SiGe films, for example, will typically represent greater than about 1 atomic % of such films, such that the above preferences apply to SiGe films. If the amount of element is in the range of 0.001 atomic percent up to 1 atomic %, the compositional non-uniformity for the Si-containing film is preferably about 100% or less, more preferably about 75% or less, even more preferably about 50% or less, most preferably about 25% or less. If the amount of element is below 0.001 atomic percent, the compositional non-uniformity for the Si-containing film is preferably in the range of about 400% or less, more preferably about 300% or less, even more preferably about 200% or less, most preferably about 100% or less. Ge content in graded SiGe films, for example, may vary over a broad range, and thus more than one of the above ranges may apply depending on the profile.

Figure 14:
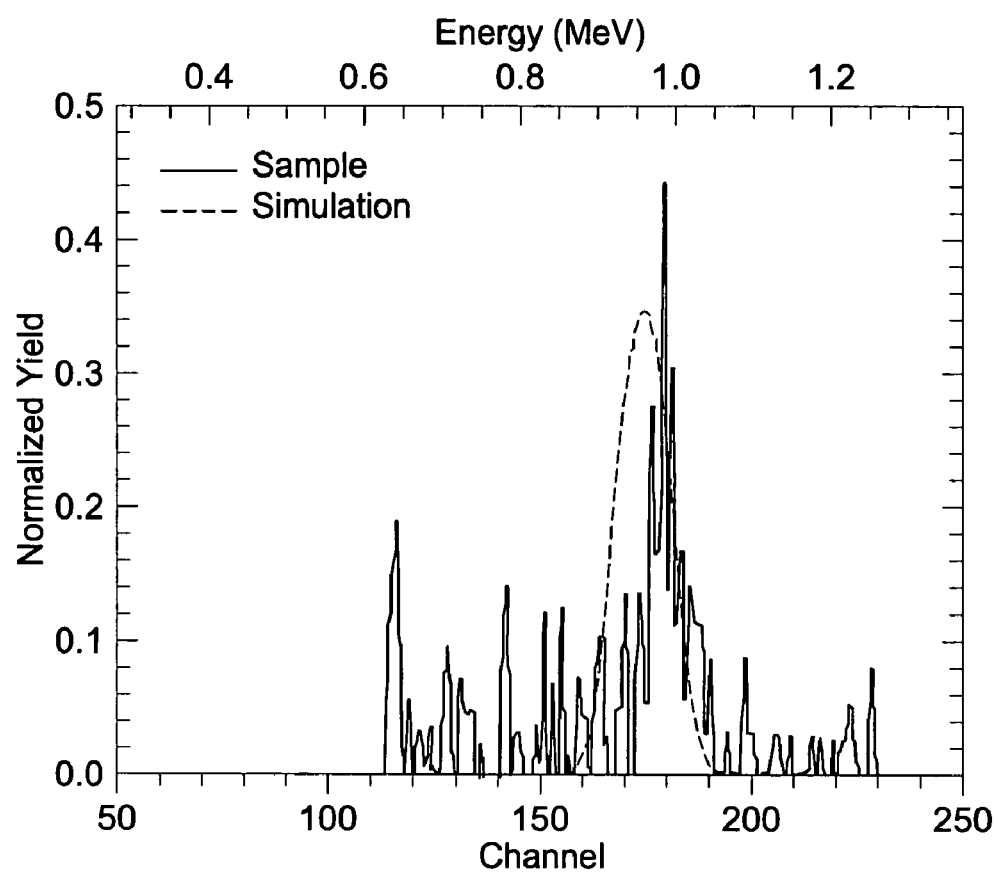
FIG. 14 shows a RBS ERD spectrum for an amorphous silicon film deposited using trisilane at 600° C., 40 Torr.

FIG. 14 is a Rutherford Backscattering spectrum (elastic recoil detection, ERD) of an amorphous silicon film deposited using trisilane at a deposition rate of 1306 Å per minute and a pressure of 40 Torr, at a deposition temperature of 600° C. The solid lines are the raw data from the film and the dashed line is a model generated from the data simulation software RUMP™ for an assumed residual hydrogen concentration of 0.5 at. %. The raw data indicate slight surface contamination, possibly due to absorbed hydrocarbons and/or moisture, but the spectrum indicates that the residual hydrogen concentration within the film is below detection limits, corresponding to a hydrogen concentration of less than 0.2 atomic %.

Figure 15:
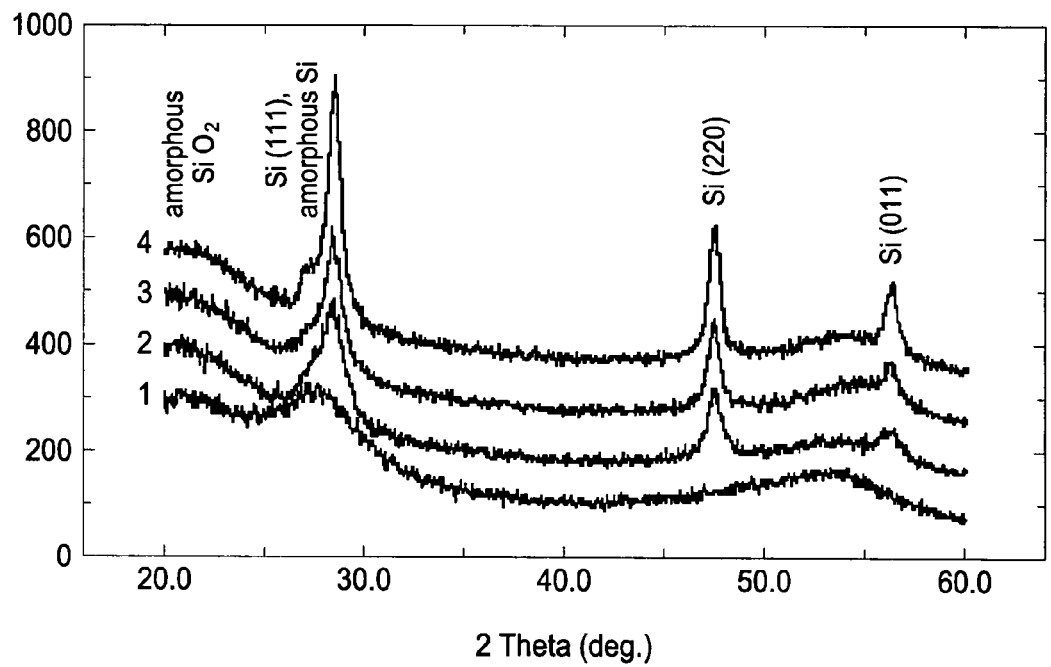
FIG. 15 shows a series of X-ray diffraction patterns obtained for films deposited using trisilane at 600° C., 650° C., 700° C. and 750° C. (bottom to top, respectively)
Figure 16:
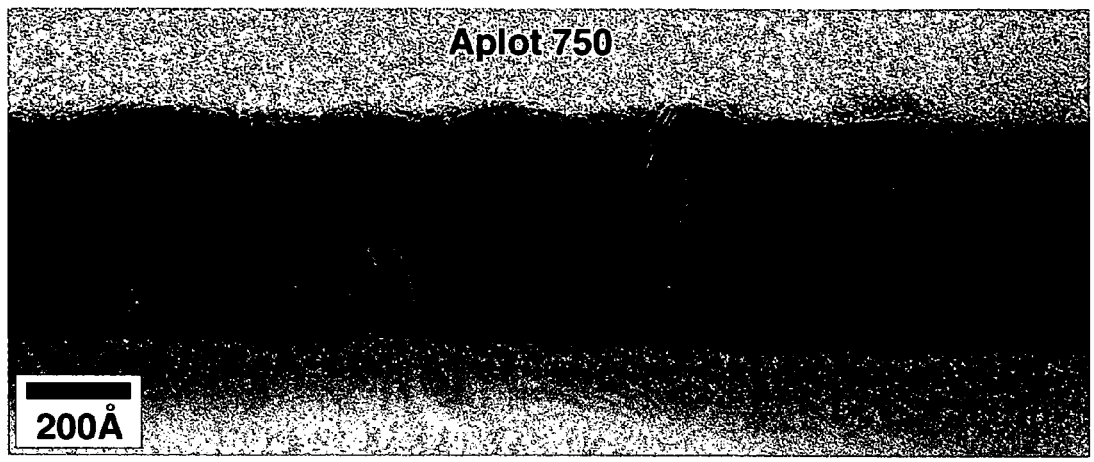
FIG. 16 is a reproduction of a transmission electron photomicrograph of a cross-sectioned polycrystalline silicon film.
Figure 17:
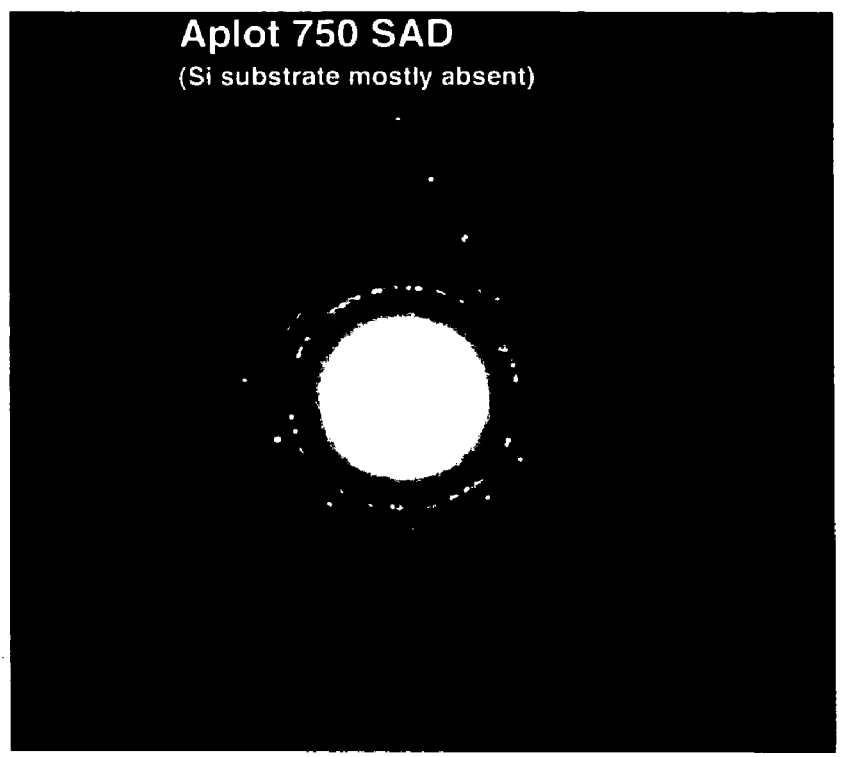
FIG. 17 shows a selected area diffraction pattern for a polycrystalline silicon film.

FIG. 15 shows X-ray diffraction spectra for a series of silicon films deposited using trisilane at deposition temperatures of 600° C., 650° C., 700° C. and 750° C. (bottom to top of FIG. 15, respectively). The X-ray diffraction patterns show that the film deposited at 600° C. was amorphous, the film deposited at 650° C. was partially crystalline, and that the films deposited at 700° C. and 750° C. were increasingly more crystalline. FIG. 16 shows a reproduction of a transmission electron photomicrograph of a cross section of the film deposited at 750° C. (middle layer), showing that it has a relatively high degree of film thickness uniformity, despite thinness, in a polycrystalline film deposited using trisilane. A selected area diffraction (SAD) pattern of the film (FIG. 17) shows no preferential orientation within the film, indicating that it was polycrystalline.

Figure 18:
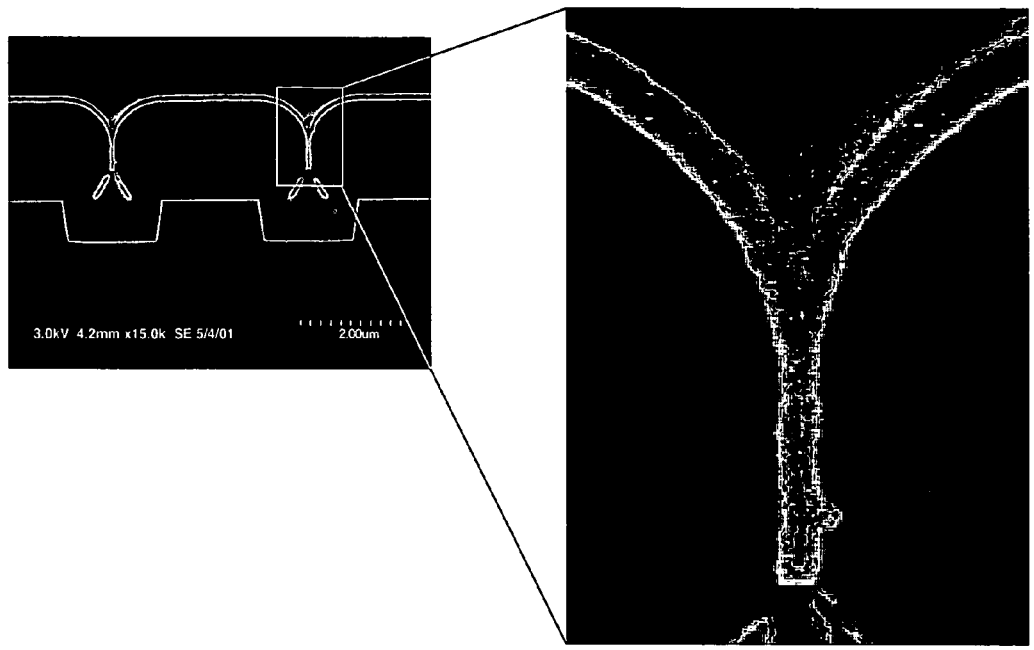
FIG. 18 is a reproduction of a scanning electron photomicrograph of a cross-sectioned conformal amorphous silicon film.

FIG. 18 shows a reproduction of a scanning electron photomicrograph of a cross section of an amorphous silicon film deposited using trisilane at 600° C. and 40 Torr. The film was deposited onto a curved substrate and shows excellent conformality even into deep, narrow seams.

In another embodiment, higher-order silanes may also be employed for the CVD synthesis, preferably low temperature, low pressure CVD, of silicon nitride (SiN) materials with compositions ranging from almost pure silicon to $Si_3N_4$. Preferred nitrogen sources include chemical precursors such as $(H_3Si)_3N$ (trisilylamine), ammonia, atomic nitrogen, and $NF_3$. Atomic nitrogen is preferably generated using a remote microwave radical generator. The relative amounts of nitrogen source and higher-order silane introduced to the CVD chamber are preferably selected to provide the resulting SiN film with a greater degree of uniformity than a comparable film made using silane in place of the higher-order silane. In a preferred embodiment, atomic nitrogen is introduced continuously, and trisilane is introduced either continuously or in pulses, preferably in one or more pulses. It has been found that greater film uniformity can be obtained by introducing the higher-order silane in pulses, and that extremely thin, highly uniform SiN films can be obtained by intermittent CVD, as demonstrated in the Examples below. Preferred SiN films prepared in accordance with this embodiment have a thickness in the range of about 10 Å to about 300 Å, more preferably about 15 Å to about 150 Å.

The use of these nitrogen sources as chemical precursors in conjunction with trisilane, especially at low temperatures, enables the deposition of SiN materials with a minimal number of N—H bonds in the thin film at deposition rates much higher than those afforded by processes which employ traditional Si sources such as silane. Similar results can be found with other higher-order silanes. For deposition temperatures in excess of 450° C., hydrogen content is preferably less than 4 atomic %, more preferably less than about 2 atomic % and most preferably less than about 1 atomic %. Preferably, deposition is conducted in the mass transport limited regime, as discussed above.

In another embodiment, higher-order silanes may also be employed for the CVD synthesis, preferably low temperature, low pressure CVD, of silicon oxide materials and silicon oxynitride materials. The low temperature/high growth rate advantages of higher-order silanes, especially under low pressure CVD conditions, provide a manufacturing advantage over processes based upon silane. The oxygen source(s) can include ozone, oxygen, water, nitric oxide, nitrous oxide, hydrogen peroxide and the like. The nitrogen sources for the introduction of nitrogen into these materials include trisilylamine, atomic nitrogen, ammonia, and $NF_3$ (as described above). Such oxygen and nitrogen sources can be employed continuously or in discrete steps or in a method involving a combination of these processes. Preferably, deposition is conducted in at least the nearly mass transport limited regime, as discussed above. Deposition using trisilylamine and trisilane is preferably conducted in the range of about 350° C. to about 750° C., more preferably about 400° C. to about 700° C., most preferably about 450° C. to about 650° C. Deposition using $NF_3$ and trisilane is preferably conducted in the range of about 300° C. to about 750° C.; more preferably about 350° C. to about 700° C., most preferably about 400° C. to about 650° C.

While separate examples are not given, for the deposition of oxides and oxynitrides, the skilled artisan will readily appreciate that the principles disclosed herein and as described above for silicon nitride and silicon germanium compound layers are equally applicable to silicon oxide deposition. Similarly, the advantages of trisilane with respect to lower activation energies and lower temperatures for achieving mass transport limited deposition have value for vapor deposition, and particularly chemical vapor deposition, of various silicon compound materials.

A preferred embodiment provides films useful in the microelectronic industry for various applications. A preferred Si-containing film has a thickness non-uniformity of less than about 2% and a compositional non-uniformity as described above, with respect to different proportions of elements in the film. Films such as described herein are useful in various applications, e.g., as a transistor gate electrode. The layers described herein are particularly useful for forming critical device layers in integrated circuits, such as gate layers in integrated transistors. Other examples include semiconductor layers in heterojunction bipolar transistors (HBT's). Processes for making such integrated circuits from such films are known to those skilled in the art. These integrated circuits may be incorporated into computer systems by methods known to those skilled in the art and thus a further preferred embodiment provides a computer system comprised of one or more of such integrated circuits.

FIG. 1 is a flow diagram showing a preferred process flow in which deposition processes described herein can be employed. A gate dielectric is formed 100 over a semiconductor substrate. The gate dielectric is cleaned 110, if necessary, and a silicon-containing layer is deposited 120, as described herein, preferably including flowing trisilane. An optional further metal layer can also be deposited 130 over the Si-containing, if desired for improved lateral signal transmission. These multiple layers are then photolithographically patterned 140, and fabrication continues 150.

Figure 2:
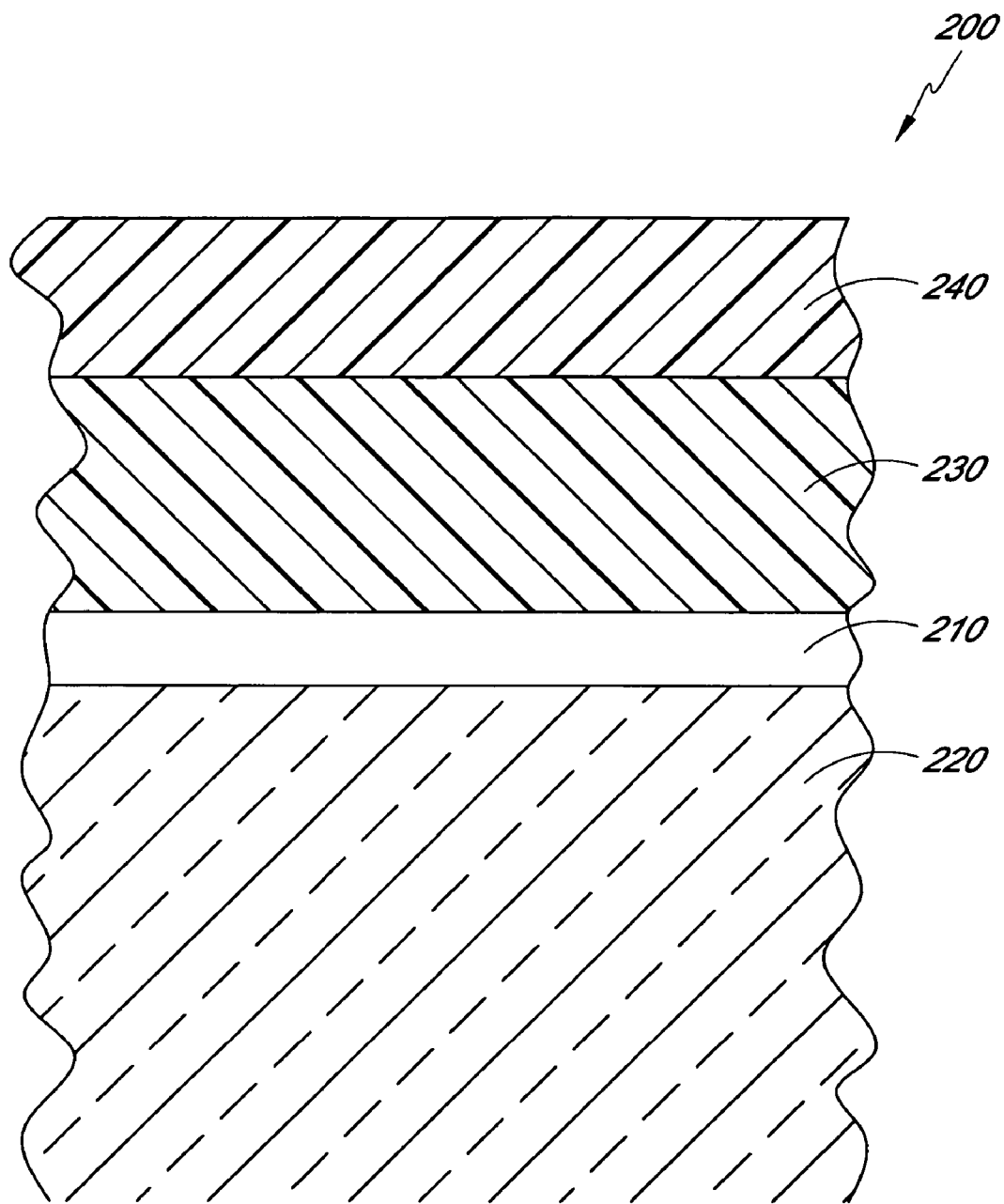
FIG. 2 illustrates a gate stack in accordance with a preferred embodiment.

FIG. 2 illustrates a gate stack 200 formed by the process of FIG. 1. A gate dielectric 210 is formed over a semiconductor substrate 220. An electrically doped Si-containing film 230 is formed over the gate dielectric 210 and an optional metal layer 240 is positioned over the Si-containing film 230 to form the gate stack 200. The stack 200 is then patterned to form gate electrodes (not shown in FIG. 2) and the fabrication of the integrated circuit is continued.

Desirably, the gate dielectric 210 comprises at least one high k material, with a dielectric constant greater than 5 and more preferably greater than 10. Exemplary materials comprise aluminum oxide, hafnium oxide and zirconium oxide, preferably formed by atomic layer deposition (ALD) for high quality, pinhole free layers. Advantageously, the use of trisilane at or near the mass transport limited regime, particularly in conjunction with a higher-order germane, compensates for slow nucleation times of traditional silicon deposition over such high k materials.

In another example, epitaxial Si-containing layers are deposited, flowing trisilane, over single-crystal substrates. Silicon layers and heteroepitaxial SiGe, SiC and SiGeC layers can be deposited by processes described herein.

Another preferred embodiment provides an apparatus for depositing a Si-containing material on a surface. This apparatus comprises a CVD chamber, a vessel containing trisilane, a feed line operatively connecting the vessel to the CVD chamber to allow passage of the trisilane from the vessel to the CVD chamber, and a temperature controller operatively disposed about said vessel and maintained at a temperature in the range of about 10° C. to about 70° C., preferably 15° C. to about 52° C., to thereby control the vaporization rate of the trisilane. Examples of suitable temperature controllers include thermoelectric controllers and/or liquid-filled jackets. Preferably, the CVD chamber is a single-wafer, horizontal gas flow reactor. Preferably, the apparatus is also comprised of a manifold operatively connected to the feed line to control the passage of the trisilane from the vessel to the chemical vapor deposition chamber. Preferably, a heat source is operatively disposed about the feed line and the gas lines are heated to about 35° C. to about 70° C., more preferably between about 40° C. and 52° C., to prevent condensation at high gas flow rates. Preferably, trisilane is introduced by way of a bubbler used with a carrier gas to entrain trisilane vapor, more preferably a temperature-controlled bubbler, most preferably a temperature-controlled bubbler in combination with heated gas lines to deliver trisilane.

EXAMPLES

The following examples were conducted using an ASM Epsilon 2000™ horizontal flow epitaxial reactor system, configured with a Bernoulli wand wafer transfer system, purge-only load locks, a non-slide concave susceptor, a 'square' pre-heat ring, adjustable spot lamps and independently tunable gas inlet injectors. The Si-containing and Ge-containing precursors were supplied to the chamber in a feed gas that also contained hydrogen and a diborane dopant. About 120 sccm of 1% $B_2H_6$ in $H_2$ was diluted in 2 slm $H_2$ and 120 sccm of this mixture was introduced into the reactor, mixed with 20 slm $H_2$ and the precursor, and deposited onto a rotating substrate under the flow rate conditions as shown in the examples. Deposition rates were estimated from oxygen and boron depth profiles using SIMS measurements and optical ellipsometer measurements (Nanometrics).

Examples 1-4

Si-containing films were deposited using trisilane as chemical precursor according to the parameters shown in Table 1. The deposition temperature was 700° C., well within the mass transport limited regime for trisilane. However, the resulting films were not uniform and instead had a concave deposition profile (thin in middle and thicker at edges) because the flow rate was inadequate (under these particular deposition conditions) to provide a uniform film.

TABLE 1

| No. | Temp. (°C.) | Pressure (Torr) | Flow Rate Set Point (sccm) | Precursor | Substrate | Deposition Profile |
|---|---|---|---|---|---|---|
| 1 | 700 | 40 | 50 | $Si_3H_8$ | $SiO_2$ | Concave |
| 2 | 700 | 40 | 45 | $Si_3H_8$ | $SiO_2$ | Concave |
| 3 | 700 | 40 | 15 | $Si_3H_8$ | $SiO_2$ | Concave |
| 4 | 700 | 40 | 25 | $Si_3H_8$ | $SiO_2$ | Concave |

Examples 5-15

Si-containing amorphous films were deposited using trisilane and silane as chemical precursors and diborane as a dopant according to the parameters shown in Table 1. About 120 sccm of 1% $B_2H_6$ in $H_2$ was diluted in 2 slm $H_2$ and 120 sccm of this mixture was introduced into the reactor where it was mixed with 20 slm $H_2$ and trisilane or silane at the flow rate shown in Table 2. These results show that much higher deposition rates were generally obtained at a given temperature using trisilane, as compared to silane, even when the flow rate for trisilane was lower than that for silane.

TABLE 2

| No. | Temp. (°C.) | Pressure (Torr) | Flow Set Point (sccm) | Precursor | Substrate | Deposition Rate (Å/min.) |
|---|---|---|---|---|---|---|
| 5C | 650 | 40 | 50 | $SiH_4$ | $SiO_2$ | 46 |
| 6C | 650 | 40 | 50 | $SiH_4$ | Si<100> | 68 |
| 7 | 650 | 40 | 50 | $Si_3H_8$ | Si<100> | 462 |
| 8C | 600 | 40 | 50 | $SiH_4$ | $SiO_2$ | 19 |
| 9C | 600 | 40 | 50 | $SiH_4$ | Si<100> | 9 |
| 10 | 600 | 40 | 20 | $Si_3H_8$ | $SiO_2$ | 359 |
| 11 | 600 | 40 | 15 | $Si_3H_8$ | Si<100> | 181 |
| 12C | 550 | 760 | 25 | $SiH_4$ | $SiO_2$ | <1 |
| 13C | 550 | 40 | 50 | $SiH_4$ | $SiO_2$ | 7 |
| 14 | 550 | 40 | 30 | $Si_3H_8$ | $SiO_2$ | 287 |
| 15C | 550 | 40 | 50 | $SiH_4$ | $SiO_2$ | 2 |

Examples 16-19

Si-containing films were deposited using trisilane and silane as chemical precursors, according to the parameters shown in Table 3. Deposition times were adjusted so that the films each had an average thickness of about 500 Å. Deposition rates were determined by measuring average film thickness using a Nanometrics ellipsometer and then dividing this number by the deposition time. Film non-uniformity was determined from a 49-point thickness map of the film thickness. The results show that a much more uniform film was obtained at a much higher deposition rate by using trisilane at the indicated temperature in place of silane. This is true at 550° C., but dramatically more so at 600° C.

TABLE 3

| No. | Precursor | Temp. (°C.) | % Non-Uniformity | Deposition Rate (Å/min.) |
|---|---|---|---|---|
| 16C | $SiH_4$ | 600 | 5.93 | 18.6 |
| 17 | $Si_3H_8$ | 600 | 0.83 | 372 |
| 18C | $SiH_4$ | 550 | 8.5 | 7.4 |
| 19 | $Si_3H_8$ | 550 | 7.31 | 287 |

Examples 20-38

Examples 1-19 are repeated except that SiGe films are obtained by using a mixture of 80% trisilane and 20% digermane in place of trisilane alone, and by using a mixture of 80% silane and 20% germane in place of silane. Higher deposition rates were observed than with the use of trisilane or silane alone.

Example 39

Figure 3:
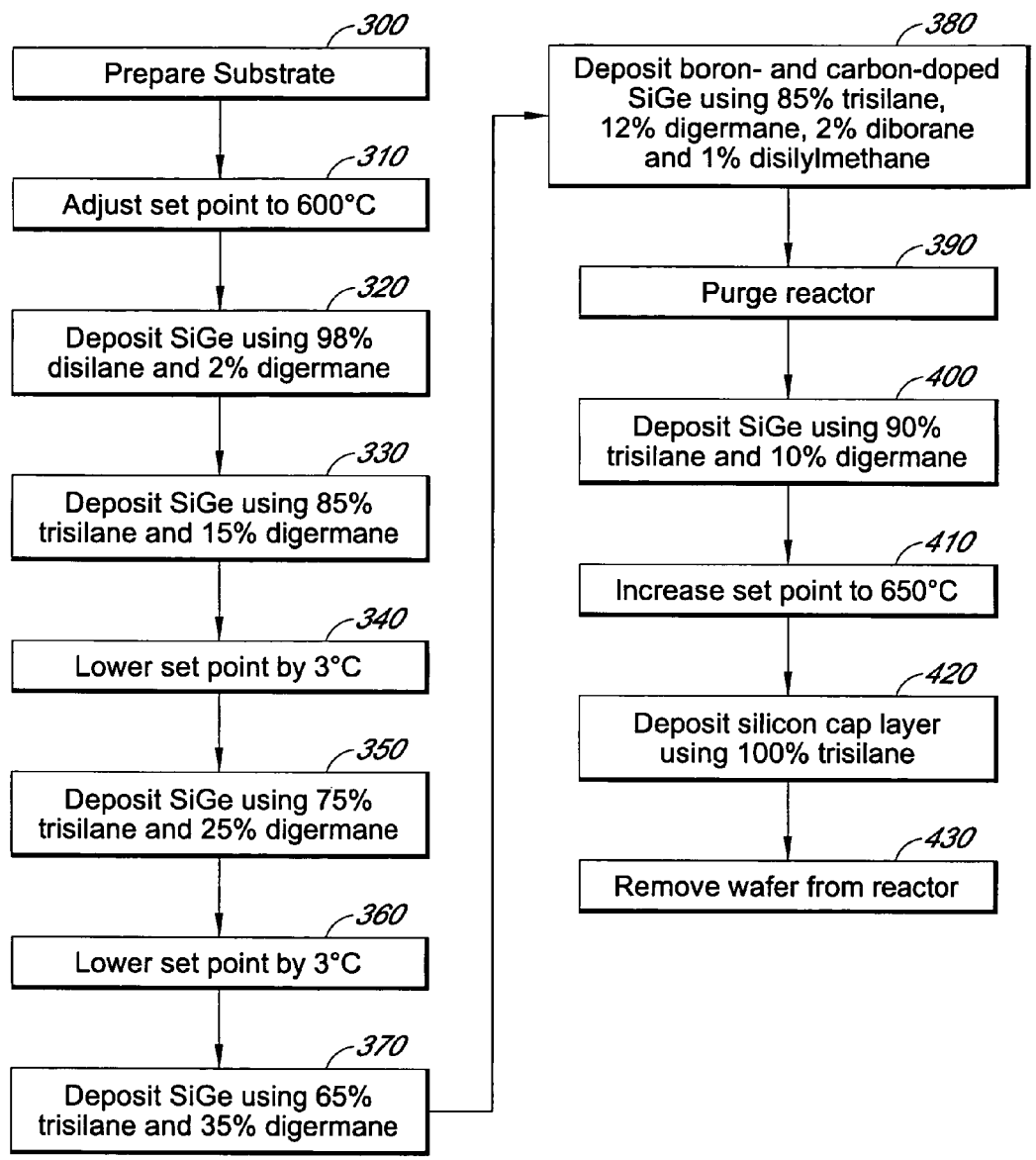
FIG. 3 is a flow chart generally illustrating the process of changing the temperature set point during the deposition process in accordance with a preferred embodiment.

A SiGe film is prepared by superlattice growth with discontinuous periodicity as follows, with reference to the flow chart shown in FIG. 3. A Si <100> substrate is prepared 300 by performing an ex-situ hydrogen-fluoride (HF) last clean to remove the native oxide layer, followed by introducing the substrate into a reactor chamber under a high flow of ultrapure hydrogen gas. The wafer is rotated at 60 rpm while the wafer is heated to about 900° C. under a high flow of hydrogen gas (to remove any contaminants from the substrate surface). The wafer is cooled and allowed to stabilize at 700° C. and an arsenic-doped silicon buffer layer about 300 Å thick is grown using trisilane and trisilylarsine under mass transport limited conditions.

The wafer temperature is adjusted 310 by cooling under hydrogen flow to 600° C. The first period of SiGe superlattice is grown 320 using 98% disilane and 2% digermane. A second period of SiGe superlattice is grown 330 using 85% trisilane and 15% digermane.

Under a flow of hydrogen, the set point temperature is lowered 340 by 3° C. and the wafer is allowed to stabilize for 30 seconds. A third period of SiGe superlattice is grown 350 using 75% trisilane and 25% digermane.

Under a flow of hydrogen, the set point temperature is lowered 350 by 3° C. and the wafer is allowed to stabilize for 30 seconds. A fourth period of SiGe superlattice is grown 370 using 65% trisilane and 35% digermane. A fifth period of SiGe superlattice doped with carbon and boron is grown 380 using 85% trisilane, 12% digermane, 2% diborane and 1% disilylmethane. Under a flow of hydrogen, the reactor is purged 390 for 30 seconds. A sixth period of SiGe superlattice is grown 400 using 90% trisilane and 10% digermane.

Under a flow of hydrogen, the temperature set point is increased 410 to 650° C. and the relative powers of the lamp banks are adjusted slightly to maximize the within-wafer uniformity of the silicon cap layer to be grown 420. The wafer is allowed to stabilize for 30 seconds. The silicon cap layer is grown using 100% trisilane. The wafer is removed 430 from the reactor and next wafer is processed.

Example 40

Figure 4:
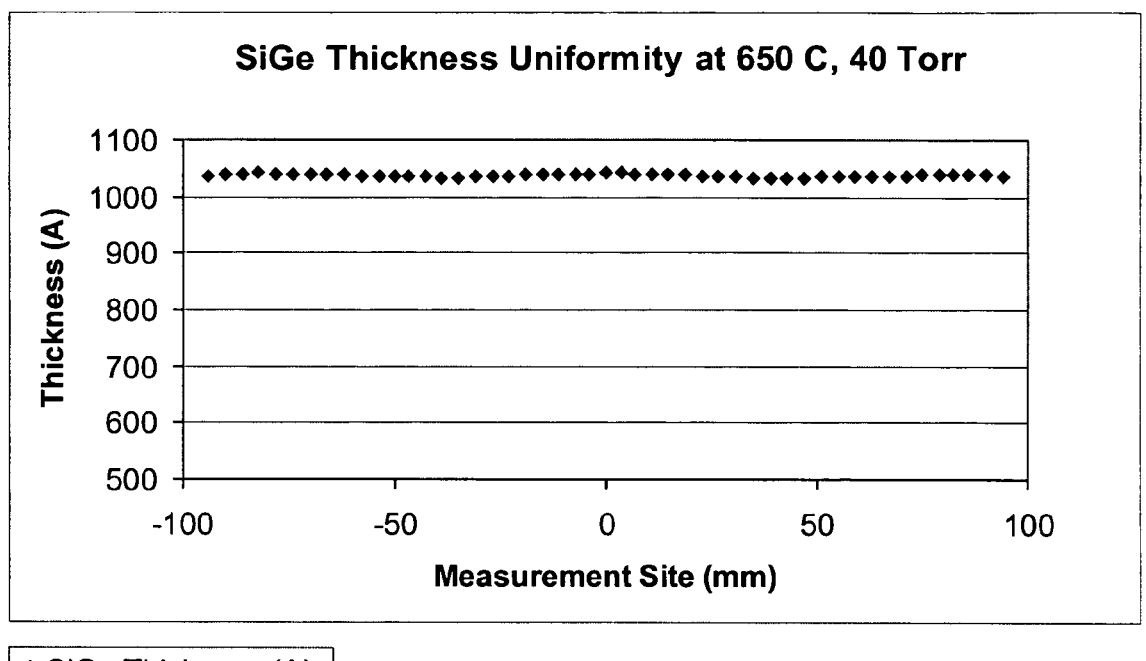
FIG. 4 shows a plot of film thickness as a function of measurement site for a preferred SiGe film.

A Si-containing film having a mean thickness of 1,038 Å was deposited using trisilane and germane as chemical precursors at a deposition temperature of 650° C. and a pressure of 40 torr. The set points for gas flow injectors had been empirically tuned in the usual manner in a series of previous runs. The resulting SiGe film had a thickness non-uniformity of 0.37% (range of 8 Å) as measured by a 49 point linear dimension scan with 6 mm edge exclusion. FIG. 4 is a plot of film thickness as a function of measurement site for this film.

Example 41

Comparative

Figure 5:
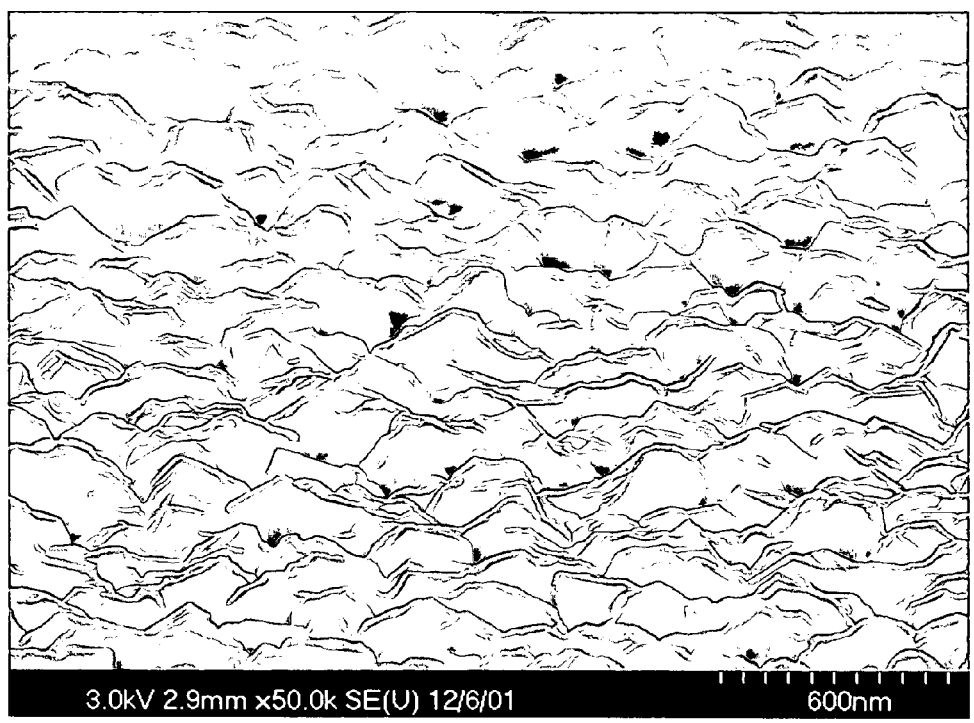
FIG. 5 is a reproduction of a scanning electron photomicrograph illustrating a SiGe film deposited using silane and germane.
Figure 6:
FIG. 6 is a reproduction of a scanning electron photomicrograph illustrating a cross section of the SiGe film shown in FIG. 5.

A Si-containing film was deposited onto a SiO₂ substrate (without a nucleation layer) at a temperature of 600° C. using silane and germane as precursors. The surface roughness of the resulting SiGe film (as measured by atomic force microscopy) was 226 Å for a 10 micron×10 micron scan area. Scanning electron microscopy (SEM) of the SiGe film revealed pyramidal, faceted grains indicative of an island-type deposition, as demonstrated in the SEM micrographs shown in FIGS. 5 and 6.

Example 42

Figure 7:
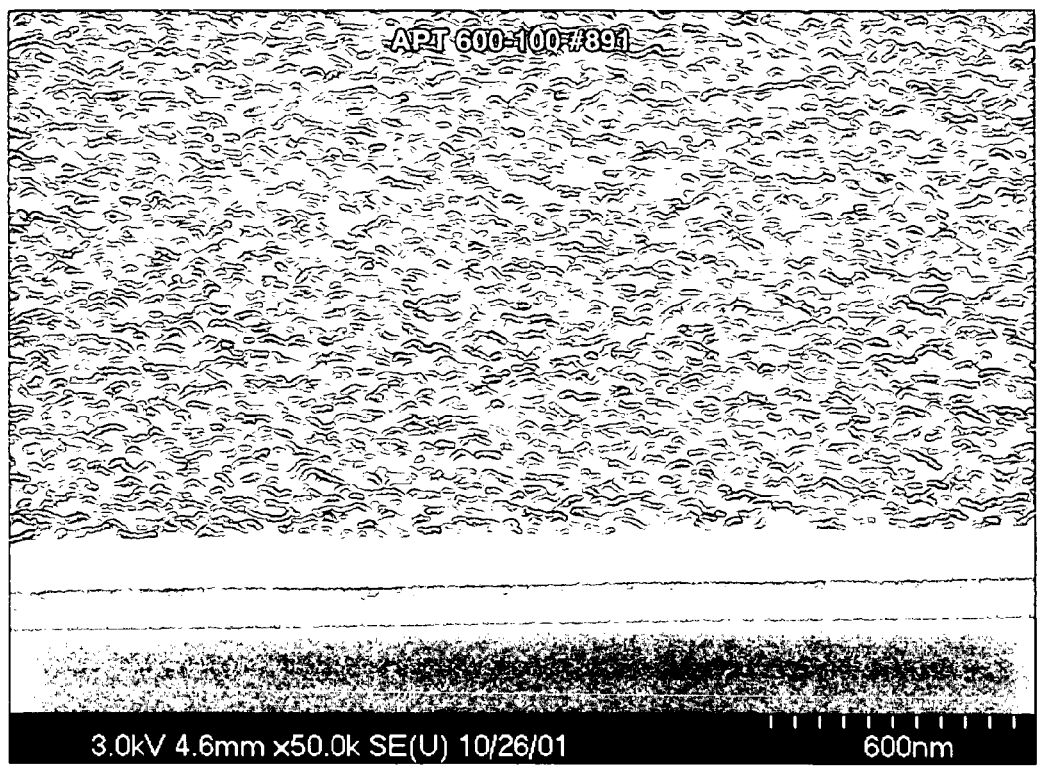
FIG. 7 is a reproduction of a scanning electron photomicrograph showing a SiGe film deposited using trisilane and germane.
Figure 8:
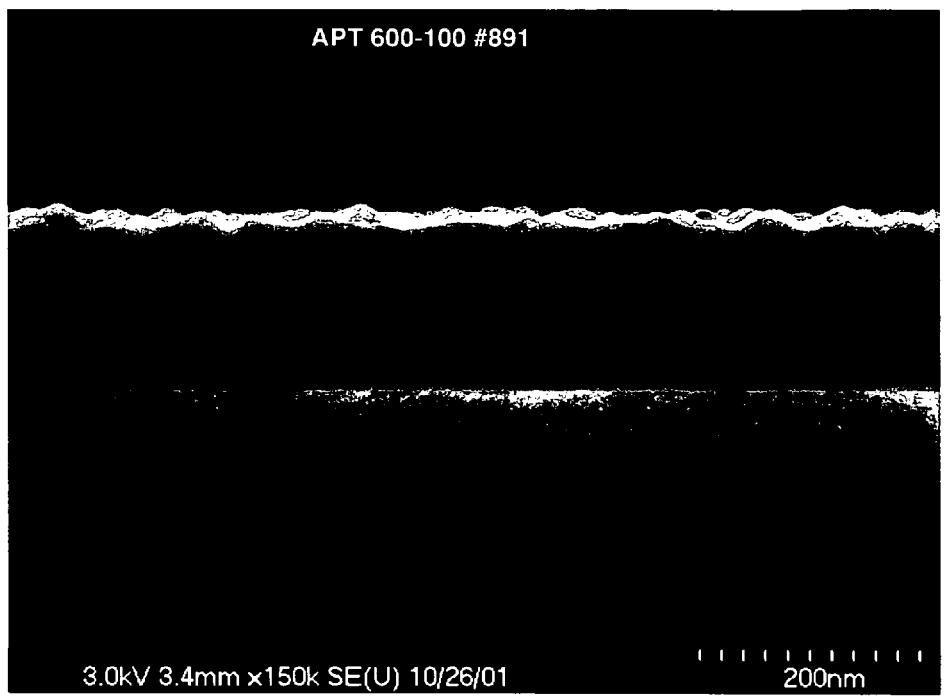
FIG. 8 is a reproduction of a scanning electron photomicrograph showing a cross section of the SiGe film shown in FIG. 7.

A Si-containing film was deposited at 600° C. as described in Example 41, but trisilane and germane was used in place of silane and germane as precursors. The surface roughness of the resulting SiGe film (as measured by atomic force microscopy) was 18.4 Å for a 10 micron×10 micron scan area. SEM of the SiGe film revealed a much more uniform surface, as demonstrated in the SEM micrographs shown in FIGS. 7 and 8 (same magnifications and tilt angles as FIGS. 5 and 6, respectively).

Examples 43-63

A series of Si-containing films were deposited onto a SiO₂ substrate (without a nucleation layer) at a pressure of 40 torr using trisilane and germane. The trisilane flow rate was constant at 77 sccm (hydrogen carrier, bubbler) for the examples of Table 4. Germane flow (10% germane, 90% H₂) and deposition temperature were varied as shown in Table 4. Germanium concentration (atomic %) and thickness of the resulting SiGe films were determined by RBS, and surface roughness was determined by atomic force microscopy (AFM). The results shown in Table 4 demonstrate that highly uniform films can be prepared over a range of temperatures and flow rate conditions, particularly over a range of germane concentration.

TABLE 4

| No. | Temp. (° C.) | Germane Flow (sccm) | % Ge | Thickness (Å) | Deposition Rate (Å/min) | Roughness (Å) |
|---|---|---|---|---|---|---|
| 43 | 450 | 25 | 5.0 | 34* | 8.5 | 3.2 |
| 44 | 450 | 50 | 7.5 | 34* | 11 | 4.1 |
| 45 | 450 | 100 | 11 | 59* | 15 | 3.7 |
| 46 | 450 | 100 | 11 | 53* | 13 | nd |
| 47 | 500 | 25 | 6.0 | 190 | 63 | 7.8 |
| 48 | 500 | 50 | 10 | 230 | 77 | 9.1 |
| 49 | 500 | 100 | 13.5 | 290 | 97 | 8.3 |
| 50 | 500 | 100 | 13.5 | 380* | 127 | 7.2 |
| 51 | 550 | 25 | 6.0 | 630 | 315 | 5.2 |
| 52 | 550 | 50 | 9.5 | 670 | 335 | 13.6 |
| 53 | 550 | 100 | 14 | 900 | 450 | 12.1 |
| 54 | 550 | 100 | 14 | 1016 | 508 | 9.4 |
| 55 | 600 | 25 | 7.0 | 1160 | 580 | 8.1 |
| 56 | 600 | 50 | 13 | 1230 | 615 | 25.7 |
| 57 | 600 | 100 | 19 | 1685 | 843 | 31.8 |
| 58 | 650 | 25 | 11 | 630 | 630 | 23.3 |
| 59 | 650 | 50 | 17 | 800 | 800 | 31.5 |
| 60 | 650 | 100 | 27 | 1050 | 1050 | 50.2 |
| 61 | 700 | 25 | 11 | 680 | 680 | 18.1 |
| 62 | 700 | 50 | 18 | 835 | 835 | 37.8 |
| 63 | 700 | 100 | 31 | 960 | 960 | 44.9 |

*Thickness measured by optical technique
nd: not determined

Examples 64-78

A series of Si-containing films were deposited on the native oxide of Si <100> substrates under the conditions shown in Table 5 using trisilane and ammonia (Examples 64-77) or silane and ammonia (comparative Example 78). The carrier gas flow was 30 slm and the ammonia flow rate was 7 slm. Table 5 shows the observed deposition rates and refractive indices ("RI") for the resulting SiN films, as well as the atomic ratio of silicon to nitrogen ("Si/N") and the hydrogen content ("% H", atomic percent) of selected films.

TABLE 5

| No. | Pressure (Torr) | Temp. (° C.) | Carrier | Silicon source/flow rate (sccm) | Deposition Rate, Å/min. | Si/N | % H | RI |
|---|---|---|---|---|---|---|---|---|
| 64 | 20 | 675 | N₂ | Trisilane/20 | 124 | 0.88 | 4 | 2.074 |
| 65 | 20 | 725 | N₂ | Trisilane/20 | 149 | 0.85 | 4 | 2.034 |
| 66 | 20 | 725 | N₂ | Trisilane/80 | 585 | 0.95 | 4 | 2.182 |
| 67 | 20 | 725 | H₂ | Trisilane/80 | 611 | 1.0 | 2.2 | 2.266 |
| 68 | 20 | 775 | N₂ | Trisilane/20 | 158 | 0.88 | 4 | 2.010 |
| 69 | 20 | 775 | H₂ | Trisilane/20 | 117 | 0.88 | 3 | 1.999 |
| 70 | 20 | 775 | N₂ | Trisilane/40 | 308 | 0.85 | 4 | 2.053 |
| 71 | 20 | 775 | N₂ | Trisilane/80 | 582 | 0.88 | 4 | 2.101 |
| 72 | 20 | 775 | H₂ | Trisilane/80 | 600 | 0.88 | 3.5 | 2.146 |
| 73 | 20 | 775 | N₂ | Trisilane/160 | 1050 | 0.88 | 4 | 2.141 |
| 74 | 20 | 775 | H₂ | Trisilane/160 | 1283 | 0.92 | 3.5 | 2.281 |
| 75 | 20 | 775 | N₂ | Trisilane/80 | 346 | nd | nd | 2.006 |
| 76 | 100 | 775 | N₂ | Trisilane/160 | 589 | nd | nd | 2.028 |
| 77 | 100 | 775 | H₂ | Trisilane/160 | 244 | nd | nd | 2.012 |
| 78 | 100 | 775 | N₂ | Silane/40 | 208 | nd | nd | 2.007 | nd: not determined

Figure 19:
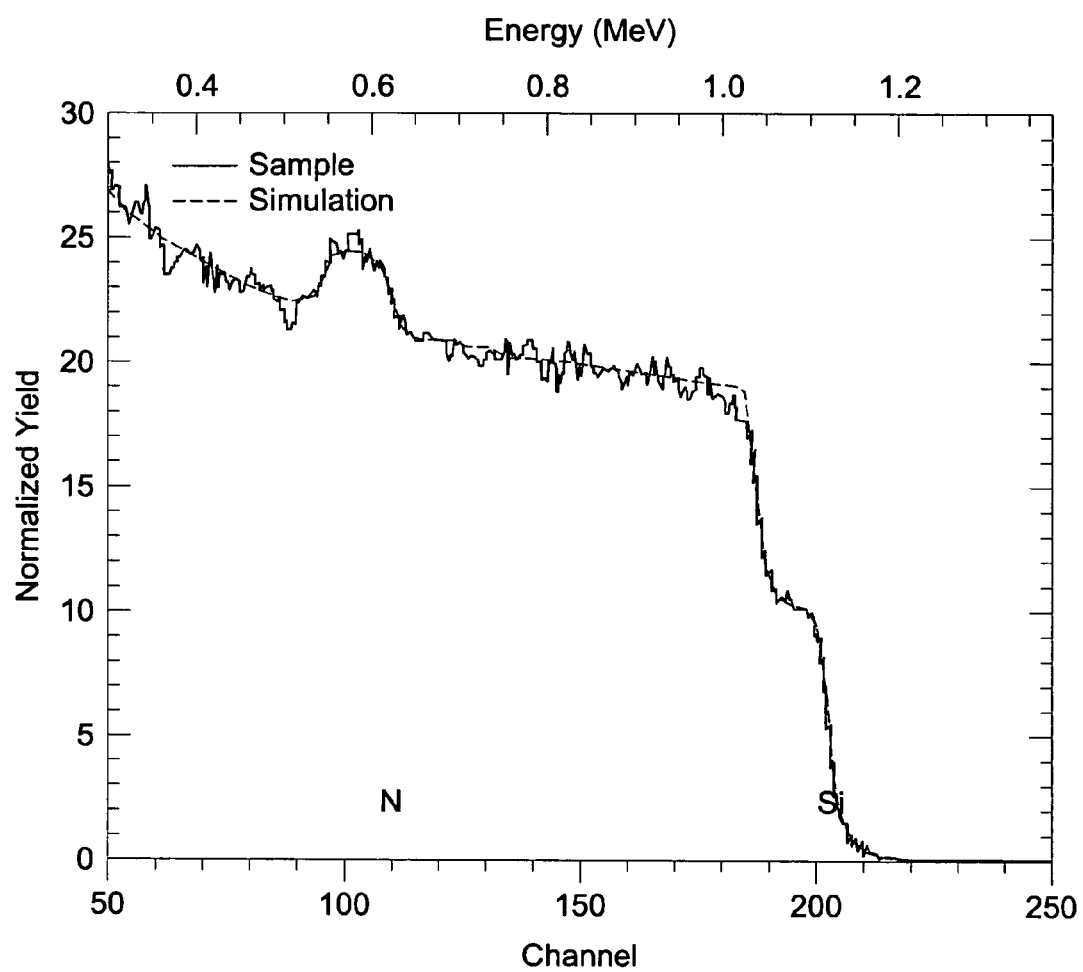
FIG. 19 shows a RBS spectrum for a silicon nitride film.
Figure 20:
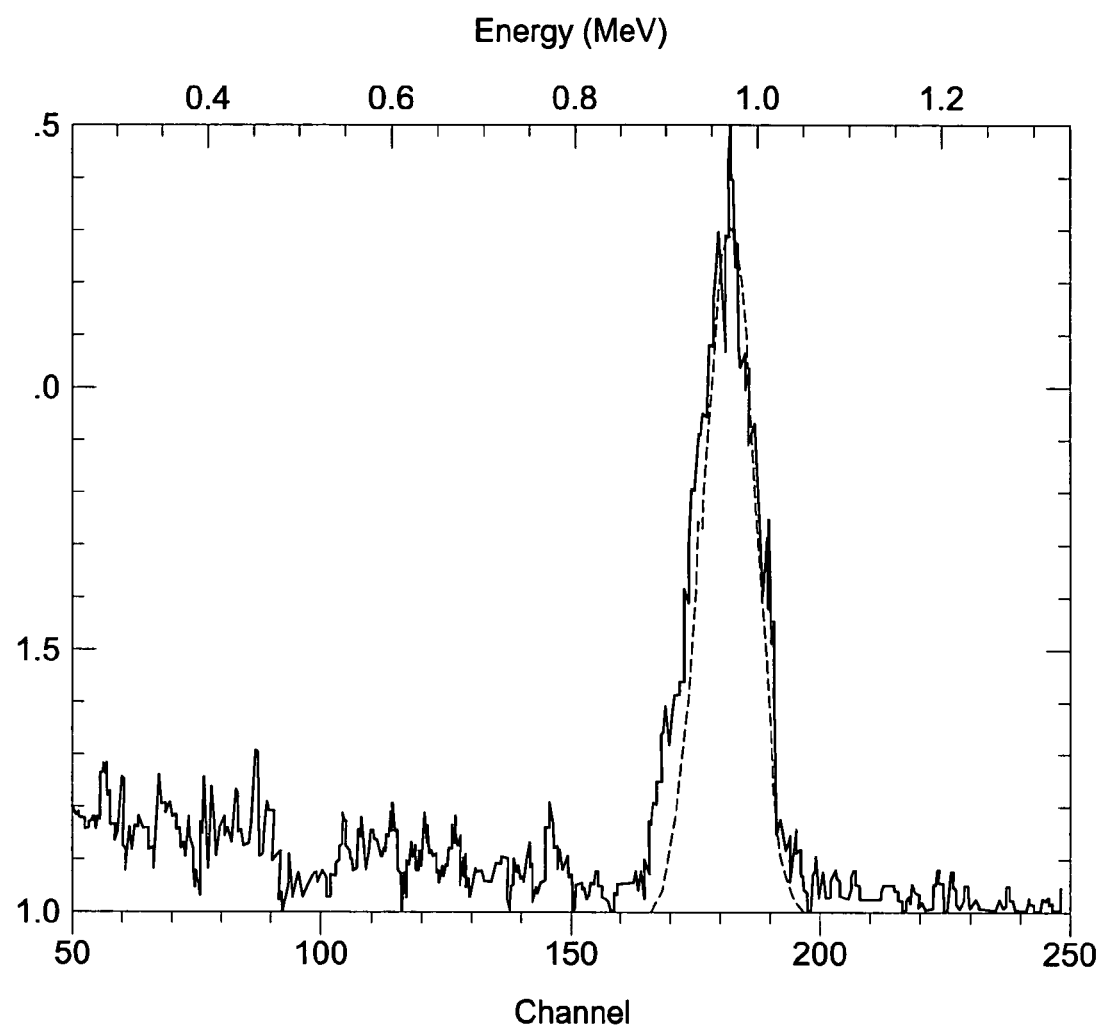
FIG. 20 shows a RBS ERD spectrum for a silicon nitride film.

The values for Si/N and % H were determined by Rutherford Backscattering (RBS). FIG. 19 is a representative RBS spectrum (2 MeV He$^{++}$) of a silicon nitride sample deposited using trisilane at 775° C. and 20 Torr. An ERD spectrum obtained using Elastic Recoil Detection (ERD) is shown in FIG. 20. These Figures show both the raw data and simulations based on the RUMP modeling program that enable quantification of the silicon, nitrogen, and hydrogen concentrations. The simulations indicate that the film has a stoichiometry of about $Si_{45}N_{51}H_4$. The RBS ERD spectrum shown in FIG. 17 also reveals that the hydrogen is distributed uniformly throughout the film.

Example 79-82

A series of Si-containing materials were deposited onto the native oxide of Si <100> substrates using trisilane and atomic nitrogen. Atomic nitrogen was generated remotely using a commercially available 800 watt microwave radical generator (MRG) and was supplied to the CVD chamber. Trisilane was supplied to the CVD chamber along with the atomic nitrogen via a bubbler using a nitrogen carrier gas at a flow rate of 5 slm (10 slm for Example 82), at the deposition temperatures shown in Table 6. Trisilane was introduced to the chamber either continuously (Example 79) or in pulses (Examples 80-82). Pulsed introduction was accomplished by continuously introducing atomic nitrogen, and introducing trisilane in pulses at intervals of about 1 minute and 30 seconds. Each of the trisilane pulses lasted about 6 seconds, under the flow conditions described above. Each of the resulting SiN films had a stoichiometry in the range of approximately $Si_{43}N_{54-56}H_{3-1}$.

Table 6 shows the thicknesses, refractive indices and hydrogen levels (atomic %) in the resulting SiN films. The SiN film of Example 79 was not uniform because it was significantly thicker at the center than the edge, and the measured refractive index varied significantly across the surface of the film (higher at center than edge). Uniformity was improved by using the pulsed processes of Examples 80-82. Uniform films can also be obtained using the continuous process by increasing the flow rate of atomic nitrogen and/or decreasing the flow rate of trisilane.

TABLE 6

| No. | Process | Deposition Temp. (° C.) | Film Thickness (Å) Center | Film Thickness (Å) Edge | Refractive Index | % H |
|---|---|---|---|---|---|---|
| 79 | Continuous | 650 | 869 | 510 | 1.97-2.2 | 2 |
| 80 | Pulsed | 650 | 324 | 268 | 1.98 | 2 |
| 81 | Pulsed | 600 | 635 | 655 | 1.96 | 3 |
| 82 | Pulsed | 650 | 1115 | 1174 | 2.02 | 0.7 |

Example 83

Figure 9:
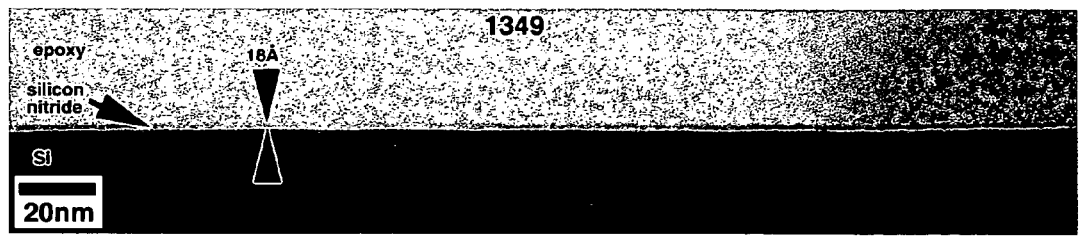
FIG. 9 is a reproduction of a transmission electron photomicrograph showing a cross section of a preferred SiN film.

A thin, uniform, continuous SiN film having a thickness of about 18 Å was deposited at 650° C. at a pressure of 3 torr using remotely generated atomic nitrogen and a single six-second pulse of trisilane, as generally described above for Examples 80-82. The film was coated with epoxy, cross-sectioned and imaged using transmission electron microscopy (TEM), as shown in the TEM photomicrograph of FIG. 9. The film/substrate interface was found to be essentially free of native oxide.

Examples 84-87

A series of epitaxial silicon films were deposited onto cleaned Si <100> substrates using trisilane at a deposition pressure of 40 Torr and various flow rates, and at the deposition temperatures and deposition rates shown in Table 7. High quality epitaxial silicon films were produced, as indicated by the χ-min values obtained from Rutherford Backscattering channeling spectra as shown in Table 7.

TABLE 7

| No. | Deposition Temperature (° C.) | Deposition Rate (Å/min) | χ-min (%) |
|---|---|---|---|
| 84 | 550 | 47 | 2.7 |
| 85 | 600 | 50 | 3.1 |
| 86 | 600 | 145 | 2.9 |
| 87 | 650 | 460 | 3.2 |

It will be appreciated by those skilled in the art that various omissions, additions and modifications may be made to the processes described above without departing from the scope of the invention, and all such modifications and changes are intended to fall within the scope of the invention, as defined by the appended claims.

We claim:

1. A process for depositing a Si-containing material on a surface, comprising:

providing a chemical vapor deposition chamber having disposed therein a substrate, wherein the chemical vapor deposition chamber is a single-wafer, horizontal gas flow reactor;

introducing a gas comprising trisilane to the chamber at a partial pressure in the range of about $1\times10^{-4}$% to about 100% of total pressure in the chamber, and at a flow rate selected to improve deposition rate and film uniformity; and depositing a Si-containing film onto the substrate at a temperature higher than 525° C., the film having a greater degree of thickness uniformity and being deposited at a substantially higher deposition rate than a comparable film made by a substantially identical process under substantially identical conditions but using silane in place of the trisilane; wherein the Si-containing film has a thickness non-uniformity of about 5% or less and is deposited at a deposition rate of about 50 Å per minute or higher.

2. The process as claimed in claim 1, wherein the substrate is maintained at a temperature of about 550° C. or higher.

3. The process as claimed in claim 1, wherein the substrate is maintained at a temperature of about 620° C. or higher.

4. The process as claimed in claim 1, wherein the chamber is maintained at a total pressure between about 1 Torr and 60 Torr.

5. The process of claim 4 in which the Si-containing film is conformal.

6. The process as claimed in claim 1, wherein the substrate is maintained at a temperature in the range of 525° C. to about 700° C.

7. The process as claimed in claim 1, wherein the substrate is maintained at a temperature in the range of about 525° C. to about 650° C.

8. The process as claimed in claim 1, wherein the deposition is carried out at a rate of about 100 Å per minute or higher.

9. The process as claimed in claim 1, wherein the gas further comprises one or more compounds selected from the group consisting of germane, digermane, trigermane, $NF_3$, monosilylmethane, disilylmethane, trisilylmethane, tetrasilylmethane, a carbon source, and a dopant precursor.

10. The process as claimed in claim 1, wherein the gas further comprises digermane.

11. The process as claimed in claim 1, wherein the Si-containing film has a thickness non-uniformity of about 1% or less.

12. The process as claimed in claim 1, wherein the Si-containing film is selected from the group consisting of a microdot, a SiGe film, a SiGeC film, a SiN film, a SiC film, a SiOC film, a SiNC film, a silicon-oxygen film, a silicon-oxygen-nitrogen film, a boron-doped film, an arsenic-doped film, an indium-doped film, an antimony-doped film, a phosphorous-doped film, and a film having a dielectric constant of about 2.2 or lower.

13. The process as claimed in claim 1, wherein the Si-containing film is silicon and the substrate is a material having a high dielectric constant.

14. The process as claimed in claim 1, wherein the Si-containing film is epitaxial.

15. The process as claimed in claim 1, wherein the Si-containing film is polycrystalline.

16. The process as claimed in claim 1, wherein the Si-containing film is amorphous.

17. The process as claimed in claim 1, further comprising patterning to form a transistor gate electrode.

18. The process of claim 1 in which the gas further comprises a carbon source.

19. The process of claim 18 in which the Si-containing film has a carbon content of about 20% or less.

20. The process of claim 18 in which the Si-containing film is selected from the group consisting of a SiGeC film, a SiC film, a SiOC film, and a SiNC film.

21. The process of claim 20 in which the substrate is a single-crystal substrate.

22. The process of claim 21 in which the Si-containing film is heteroepitaxial.

23. The process of claim 18 in which the chamber is a single-wafer, horizontal gas flow reactor.

24. The process of claim 18 in which the carbon source is selected from the group consisting of a silylmethane, a hydrocarbon, carbon monoxide, carbon dioxide and HCN.

25. The process of claim 18 in which the deposition of the Si-containing film is conducted at a chamber pressure in the range of about 0.1 Torr to about 200 Torr.

26. The process of claim 25 in which the SiGe film is conformal.

27. The process of claim 18 in which the deposition of the Si-containing film is conducted at a substrate temperature in the range of about 450° C. to about 700° C.

28. A process for depositing a SiGe material on a surface, comprising:
    providing a chemical vapor deposition chamber having disposed therein a substrate, wherein the chemical vapor deposition chamber is a single-wafer, horizontal gas flow reactor;
    introducing a gas comprised of a higher-order silane of the formula $Si_mH_{2m+2}$, where m=2-6, and a higher-order germane of the formula $Ge_nH_{2n+2}$, where n=2-4, to the chamber at a partial pressure in the range of about $1\times10^{-4}$% to about 100% of total pressure in the chamber, and at a flow rate selected to improve deposition rate and film uniformity; and
    depositing a SiGe film onto the substrate,
    wherein the SiGe film has greater thickness uniformity than a comparable film made by a substantially identical process under substantially identical conditions but using silane in place of the higher-order silane; wherein the SiGe film has a thickness non-uniformity of about 5% or less and is deposited at a deposition rate of about 50 Å per minute or higher.

29. The process as claimed in claim 28, wherein the higher-order silane is selected from the group consisting of disilane, trisilane, and tetrasilane.

30. The process as claimed in claim 28, wherein the higher-order silane is trisilane and the higher-order germane is digermane.

31. The process as claimed in claim 28, wherein the depositing is carried out at a temperature in the range of 475° C. to about 700° C.

32. The process as claimed in claim 28, wherein the depositing is carried out at a rate of about 100 Å per minute or higher.

33. The process as claimed in claim 28, wherein the gas further comprises one or more compounds selected from the group consisting of monosilylmethane, disilylmethane, trisilylmethane, tetrasilylmethane, and a dopant precursor.

34. The process as claimed in claim 28, wherein the SiGe film has greater thickness uniformity than a comparable film made by a substantially identical process under substantially identical conditions but using germane in place of the higher-order germane.

35. The process as claimed in claim 28, further comprising patterning to form a transistor gate electrode.

36. A process for depositing a Si-containing material on a surface, comprising:
    providing a chemical vapor deposition chamber having disposed therein a substrate, wherein the chemical vapor deposition chamber is a single-wafer, horizontal gas flow reactor;
    introducing a gas comprising trisilane and a carbon source to the chamber at partial pressures in the range of about $1\times10^{-4}$% to about 100% of total pressure in the chamber, and at flow rates selected to improve deposition rate and film uniformity; and
    depositing a Si-containing film onto the substrate, the film comprising carbon, wherein the Si-containing film has greater thickness uniformity than a comparable film made by a substantially identical process under substantially identical conditions but using silane in place of the trisilane; wherein the Si-containing film has a thickness non-uniformity of about 5% or less and is deposited at a deposition rate of about 50 Å per minute or higher.

37. The process of claim 36 in which the Si-containing film has a carbon content of about 20% or less.

38. The process of claim 36 in which the Si-containing film is selected from the group consisting of a SiGeC film, a SiC film, a SiOC film, and a SiNC film.

39. The process of claim 36 in which the substrate is a single-crystal substrate.

40. The process of claim 39 in which the Si-containing film is heteroepitaxial.

41. The process of claim 36 in which the Si-containing film is deposited onto the substrate under substantially mass transport limited conditions.

42. The process of claim 36 in which the carbon source is selected from the group consisting of a silylmethane, a hydrocarbon, carbon monoxide, carbon dioxide and HCN.

43. The process of claim 36 in which the deposition of the Si-containing film is conducted at a chamber pressure in the range of about 0.1 Torr to about 200 Torr.

44. The process of claim 36 in which the deposition of the Si-containing film is conducted at a substrate temperature in the range of about 450° C. to about 700° C.

45. The process of claim 43 in which the Si-containing film is conformal.

46. The process of claim 36 in which the carbon source in the chamber has a partial pressure of about 1% or less.

* * * * *

UNITED STATES PATENT AND TRADEMARK OFFICE
CERTIFICATE OF CORRECTION

PATENT NO. : 7,585,752 B2
APPLICATION NO. : 10/963043
DATED : September 8, 2009
INVENTOR(S) : Todd et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 53 days.

Signed and Sealed this

Fourteenth Day of September, 2010

David J. Kappos
*Director of the United States Patent and Trademark Office*